United States Patent
Tai et al.

(10) Patent No.: US 9,214,545 B2
(45) Date of Patent: Dec. 15, 2015

(54) DUAL GATE OXIDE TRENCH MOSFET WITH CHANNEL STOP TRENCH

(71) Applicant: Alpha and Omega Semiconductor Incorporated, Sunnyvale, CA (US)

(72) Inventors: Sung-Shan Tai, San Jose, CA (US); Sik Lui, Sunnyvale, CA (US); Xiaobin Wang, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/563,974

(22) Filed: Dec. 8, 2014

(65) Prior Publication Data

US 2015/0097232 A1    Apr. 9, 2015

Related U.S. Application Data

(60) Continuation of application No. 13/780,579, filed on Feb. 28, 2013, now Pat. No. 8,907,416, which is a division of application No. 12/782,573, filed on May 18, 2010, now Pat. No. 8,394,702, which is a continuation-in-part of application No. 12/731,112, filed on Mar. 24, 2010, now Pat. No. 8,367,501.

(51) Int. Cl.
| | |
|---|---|
| *H01L 29/66* | (2006.01) |
| *H01L 21/336* | (2006.01) |
| *H01L 29/78* | (2006.01) |
| *H01L 29/40* | (2006.01) |
| *H01L 29/06* | (2006.01) |
| *H01L 29/08* | (2006.01) |

(Continued)

(52) U.S. Cl.
CPC .......... *H01L 29/7813* (2013.01); *H01L 29/407* (2013.01); *H01L 29/66727* (2013.01); *H01L 29/66734* (2013.01); *H01L 29/7811* (2013.01); *H01L 29/0638* (2013.01); *H01L 29/0653* (2013.01); *H01L 29/0878* (2013.01); *H01L 29/41766* (2013.01); *H01L 29/4236* (2013.01); *H01L 29/456* (2013.01)

(58) Field of Classification Search
None
See application file for complete search history.

(56) References Cited

U.S. PATENT DOCUMENTS

| | | | |
|---|---|---|---|
| 6,069,043 A | 5/2000 | Floyd et al. | |
| 6,710,403 B2 | 3/2004 | Sapp | |

(Continued)

FOREIGN PATENT DOCUMENTS

TW    200913150 A    3/2009

OTHER PUBLICATIONS

Chinese Office Action for CN Application No. 201110080270.4, dated Mar. 18, 2013.

(Continued)

*Primary Examiner* — Michael Jung
(74) *Attorney, Agent, or Firm* — Joshua D. Isenberg; JDI Patent

(57) ABSTRACT

A semiconductor device has a plurality of gate electrodes over a gate insulator layer formed in active trenches located in an active region of a semiconductor substrate. A first gate runner is formed in the semiconductor substrate and electrically connected to the gate electrodes. The first gate runner abuts and surrounds the active region. A second gate runner is connected to the first gate runner to make contact to a gate metal. A dielectric filled trench surrounds the first and second gate runners and the active region and a highly doped channel stop region is formed under the dielectric filled trench.

14 Claims, 24 Drawing Sheets

(51) Int. Cl.
  *H01L 29/417* (2006.01)
  *H01L 29/423* (2006.01)
  *H01L 29/45* (2006.01)

(56) References Cited

U.S. PATENT DOCUMENTS

| | | | |
|---|---|---|---|
| 7,504,303 | B2 | 3/2009 | Yilmaz et al. |
| 8,187,939 | B2 | 5/2012 | Tai et al. |
| 8,193,580 | B2 | 6/2012 | Chen et al. |
| 8,324,683 | B2 | 12/2012 | Lui et al. |
| 8,367,501 | B2 | 2/2013 | Lui et al. |
| 8,394,702 | B2 | 3/2013 | Tai et al. |
| 8,637,926 | B2 | 1/2014 | Lui et al. |
| 8,907,416 | B2 | 12/2014 | Tai et al. |
| 2004/0031987 | A1 | 2/2004 | Henninger et al. |
| 2004/0056302 | A1 | 3/2004 | Grebs et al. |
| 2006/0273386 | A1 | 12/2006 | Yilmaz et al. |
| 2007/0004116 | A1 | 1/2007 | Hshieh |
| 2007/0155104 | A1 | 7/2007 | Marchant et al. |
| 2007/0194374 | A1 | 8/2007 | Bhalla et al. |
| 2008/0067584 | A1* | 3/2008 | Lui et al. .............. 257/330 |
| 2008/0121986 | A1 | 5/2008 | Hshieh |
| 2009/0085105 | A1 | 4/2009 | Su et al. |
| 2009/0315103 | A1 | 12/2009 | Hsieh |
| 2010/0140695 | A1 | 6/2010 | Yedinak et al. |
| 2010/0140697 | A1* | 6/2010 | Yedinak et al. .............. 257/334 |
| 2011/0039383 | A1 | 2/2011 | Chen et al. |
| 2011/0068386 | A1 | 3/2011 | Tai et al. |
| 2011/0121386 | A1 | 5/2011 | Hsieh |
| 2011/0233666 | A1 | 9/2011 | Lui et al. |
| 2012/0098059 | A1 | 4/2012 | Tai et al. |
| 2012/0132988 | A1 | 5/2012 | Lui et al. |
| 2014/0138767 | A1 | 5/2014 | Lui et al. |

OTHER PUBLICATIONS

Final Office Action dated Nov. 4, 2011 for U.S. Appl. No. 12/565,611, 13 pages.
Final Office Action for U.S. Appl. No. 13/780,579, dated Aug. 28, 2013.
Final Office Action for U.S. Appl. No. 13/780,579, dated May 1, 2014.
Non Final Office Action dated Apr. 3, 2013 for U.S. Appl. No. 13/747,262 9 pages.
Non Final Office Action dated Jul. 19, 2012 for U.S. Appl. No. 12/782,573 16 pages.
Non Final Office Action dated Jun. 15, 2012 for U.S. Appl. No. 12/731,112 7 pages.
Non Final Office Action date May 16, 2011 for U.S. Appl. No. 12/565,611 12 pages.
Non Final Office Action dated Nov. 18, 2011 for U.S. Appl. No. 12/731,112 7 pages.
Non-Final Office Action for U.S. Appl. No. 14/165,083, dated May 9, 2014.
Non-Final Office Action for U.S. Appl. No. 13/780,579, dated May 23, 2013.
Non-Final Office Action for U.S. Appl. No. 13/780,579, dated Dec. 5, 2013.
Notice of Allowance for U.S. Appl. No. 13/780,579, dated Aug. 12, 2014.
Notice of Allowance for U.S. Appl. No. 14/165,083, dated Oct. 8, 2014.
U.S. Appl. No. 14/165,083, to Sik Lui, et al., filed Jan. 27, 2014.
U.S. Appl. No. 12/731,112, to Sik Lui, et al., filed Mar. 24, 2010.
U.S. Appl. No. 13/367,916, to Sik Lui, et al., filed Feb. 7, 2012.
U.S. Appl. No. 13/780,579, to Sung-Shan Tai, et al., filed Feb. 28, 2013.
U.S. Appl. No. 12/782,573, to Sung-Shan Tai, et al., filed May 18, 2010.
Non-Final Office Action for U.S. Appl. No. 14/060,900, dated May 9, 2015.
Notice of Allowance for U.S. Appl. No. 14/606,900, dated Aug. 5, 2015.

* cited by examiner

DUAL GATE OXIDE TRENCH MOSFET WITH CHANNEL STOP TRENCH

CLAIM OF PRIORITY

This Application is a continuation of U.S. patent application Ser. No. 13/780,579, filed Feb. 28, 2013, to Sung-Shan Tai et al. entitled "DUAL GATE OXIDE TRENCH MOSFET WITH CHANNEL STOP TRENCH", now U.S. Pat. No. 8,907,416, the entire disclosures of which are incorporated by reference herein.

U.S. patent application Ser. No. 13/780,579 is a divisional of U.S. patent application Ser. No. 12/782,573, filed May 18, 2010, to Sung-Shan Tai et al. entitled "METHOD FOR MAKING DUAL GATE OXIDE TRENCH MOSFET WITH CHANNEL STOP USING THREE OR FOUR MASKS PROCESS", now U.S. Pat. No. 8,394,702, the entire disclosures of which are incorporated by reference herein.

U.S. patent application Ser. No. 12/782,573 is a continuation-in-part of and claims the priority benefit of commonly-assigned U.S. patent application Ser. No. 12/731,112, filed Mar. 24, 2010 to Sik Lui et al. entitled "OXIDE TERMINATED TRENCH MOSFET WITH THREE OR FOUR MASKS", now U.S. Pat. No. 8,367,501, the entire disclosures of which are incorporated by reference herein.

FIELD OF THE INVENTION

This invention generally relates trench metal oxide semiconductor field effect transistors (MOSFETS and more particularly to oxide terminated trench MOSFETs and a method of forming the devices with three or four masks.

BACKGROUND OF THE INVENTION

A DMOS (Double diffused MOS) transistor is a type of MOSFET (Metal Oxide Semiconductor Field Effect Transistor) that uses two sequential diffusion steps aligned to the same edge to form the channel region of the transistor. DMOS transistors are often high current devices for low and high voltages, used either as discrete transistors or as components in power integrated circuits. DMOS transistors can provide high current per unit area with a low forward voltage drop.

One particular type of DMOS transistor is a so-called trench DMOS transistor in which the channel is present on the sidewall of a trench, with the gate formed in the trench, which extends from the source towards the drain. The trench gate, which is lined with a thin oxide layer and filled with polysilicon, allows less constricted current flow than a planar gate DMOS transistor structure and thereby provides lower values of specific on-resistance.

However, a conventional method of making such a trench DMOS field effect transistor requires a five to six masks process that is expensive and time consuming.

It is within this context that embodiments of the present invention arise.

BRIEF DESCRIPTION OF THE DRAWINGS

Objects and advantages of the invention will become apparent upon reading the following detailed descriptions and upon reference to the accompanying drawings in which:

FIG. 2B-1 is another top view of the layout of a dual gate oxide trench MOSFET 200 shown in FIG. 2A.

FIG. 2B-2 is a cross-sectional view of the dual gate oxide trench MOSFET described in FIG. 2A along the lines A-A and B-B.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Introduction

A conventional method of making a trench MOSFET requires five or six masks. The first mask is a deep well mask, which is also used for high voltage termination. This mask is optional depending on whether the resulting device is a high-voltage device. The second mask is a trench mask, which is used to form trenches for gates and other device structures. The third mask is a body mask, which is also used for forming a termination region that protects gate oxide in the gate runner from rupture due to exposure to drain potential and shields gate pads/gate runners from the drain voltage. The fourth mask is a source mask that moves the source regions away from gate runner and termination regions to divert breakdown current away from those regions to improve unclamped inductive switching (UIS) capability. The fourth mask is also used for forming a channel stop. The fifth mask is a contact mask used for forming source/body and gate contacts and the sixth mask is a metal mask used to separate a metal layer into gate and source metal regions.

Figure 1:
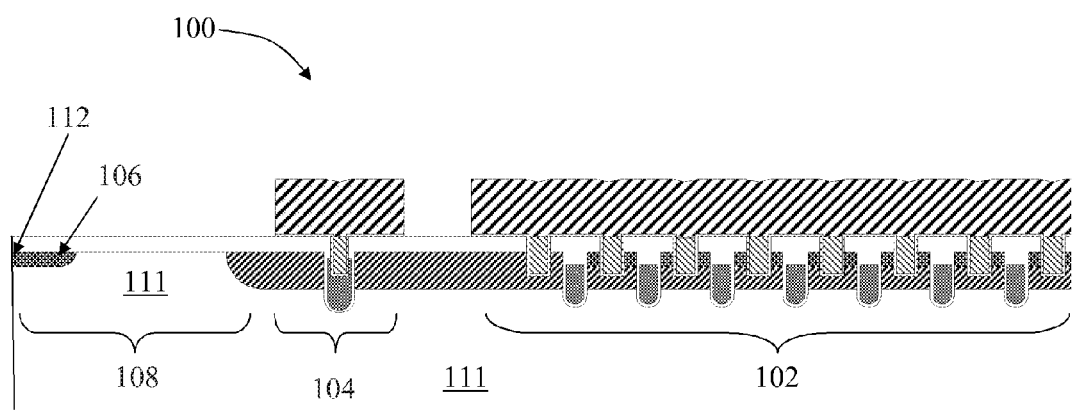
FIG. 1 is a cross-sectional view of a conventional trench MOSFET device.

FIG. 1 is a cross-sectional view of a trench MOSFET 100, which is made by the conventional six masks process as described above. As shown in FIG. 1, the trench MOSFET 100 includes active cells 102 located in an active region and a gate runner 104. The gate runner connects to gates in the active cells 102. There is a slight risk of a p-inversion channel forming along the top surface of the N− epitaxial layer 111 towards the ends of the die. The p-inversion channel can cause leakage between source/body and drain if it reaches the die edge 112 from the junction termination 108. A heavily doped N+ channel stop 106 prevents such a p-inversion channel from reaching the die edge 112 where it could short to the drain.

Embodiments

In embodiments of the present invention, the existing junction termination in a conventional trench MOSFET can be replaced with a thick gate oxide in the gate runner area to terminate the active cell area, which eliminates junction termination breakdown, improves the UIS capability, and saves space occupied by the junction termination because the oxide requires much less space than a conventional junction termination. In addition, reverse recovery is improved by confining the built-in body diode to the active area.

Figure 2A:
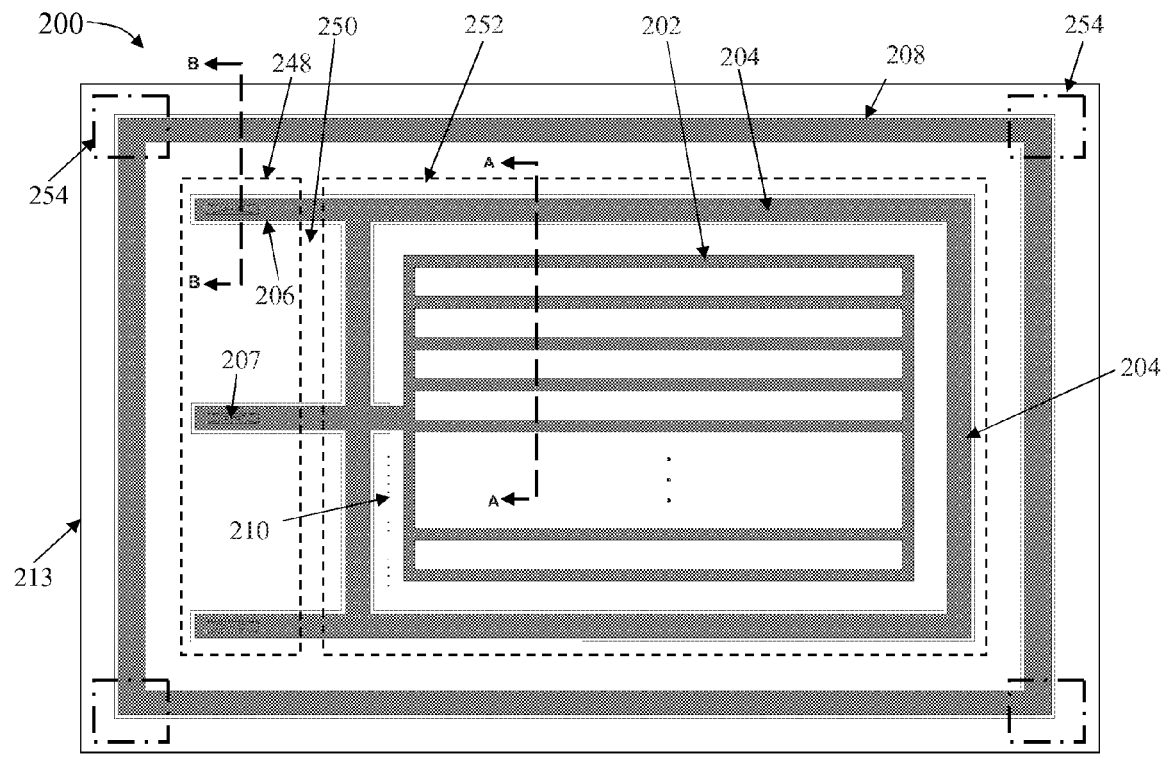
FIG. 2A is a top view of a layout of the dual gate oxide trench MOSFET of the first embodiment of the present invention.
Figures 1, 2B:
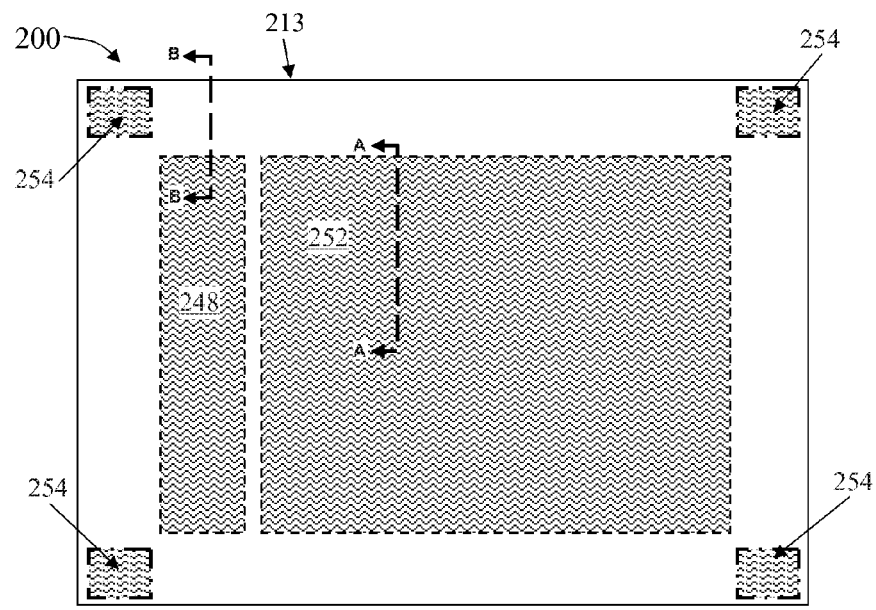
Figures 2, 2B:
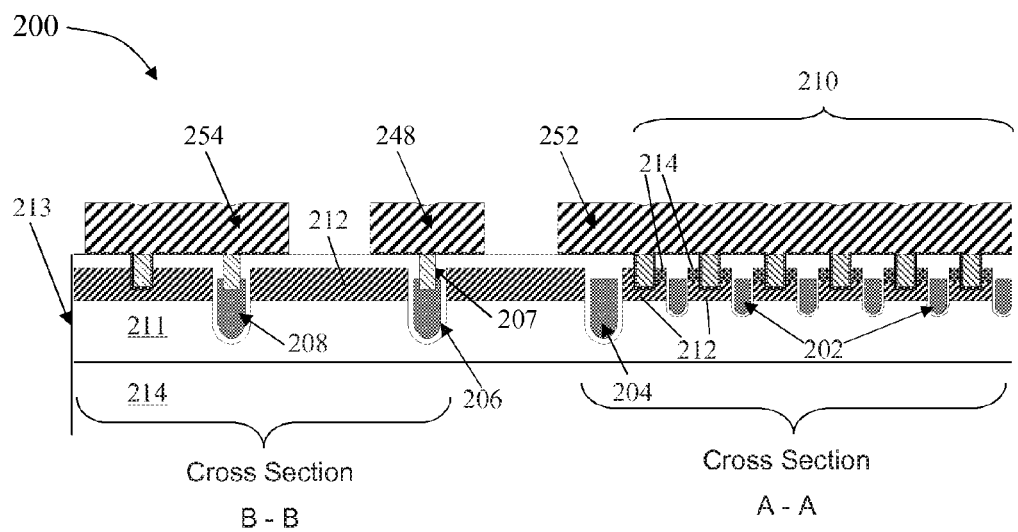

FIG. 2A is a top view of a layout of the dual gate oxide trench MOSFET 200 of a first embodiment of the present invention and FIG. 2B-2 is a cross-sectional view of the dual gate terminated trench MOSFET 200 along the lines A-A and B-B. The method for making the oxide termination trench MOSFET 200 only requires four masks: a trench mask, a gate oxide mask, a contact mask and a metal mask, which is described later in FIGS. 4A-4R.

As shown in FIGS. 2A and 2B-2, the trench MOSFET 200 includes gate electrodes formed in oxide lined trenches 202 located in an active cell area 210. Gate runners are formed in a wider set of oxide lined trenches. The gate runners include a first portion 204 that abuts and surrounds the active cell area 210. The gate runners include a second portion 206 that makes contact to a gate metal layer 248 (outline indicated by dashed lines on FIG. 2A) through contacts 207. A termination structure 208 is formed in another oxide lined trench that surrounds the gate runners 204, 206 and the active area 210. The termination structure 208 can be shorted to a body or source region of the device 200 through a termination metal 254 and suitable contacts at certain points. The gate metal 248 and source metal 252 are electrically isolated from each other by a gap 250, which may be filled with an insulating material. The shorted termination structure 208 acts as a channel stop. By way of example, in the embodiment shown in FIG. 2B-2, an n-type (in the case of an n-channel MOSFET device) source layer 214 might only be formed on a top portion of a p-body layer 212 in the active cell area. The gate oxide of the active area gate trenches 202 is much thinner than the gate oxide of gate runner 204. The thick gate oxide of gate runners 204 and termination trench 208 is thick enough, e.g., about 1000 Angstroms to 2000 Angstroms, to sufficiently support the breakdown voltage; the required thickness depends on the voltage rating of the device. The gate oxides in gate runner trenches 204, 206 and termination trench 208 are thicker than the gate oxide in active gate trenches 202, thus the device 200 can be said to have dual gate oxide thicknesses. The gate electrodes in the gate runners 206 and 204 and in active area gate trenches 202 are connected together to the device gate potential. The gate electrode in the termination trench 208 can be connected to the body region by the die edge 213, which is at device drain potential.

FIG. 2B-1 is another top view of the layout of dual gate oxide trench MOSFET 200 shown in FIG. 2A, except that FIG. 2B-1 only shows the metal layers for illustrative purposes. A source metal 252 covers the active area 210 and the surrounding gate runners 204. A gate metal 248 covers the gate pickup portions 206 of the gate runners, and the termination metal 254 contacts portions of the termination trench 208 surrounding the device. In the layout shown in FIGS. 2A and 2B-1, the termination metal 254 contacts the termination trench 208 at the corners of the die.

Figure 2C:
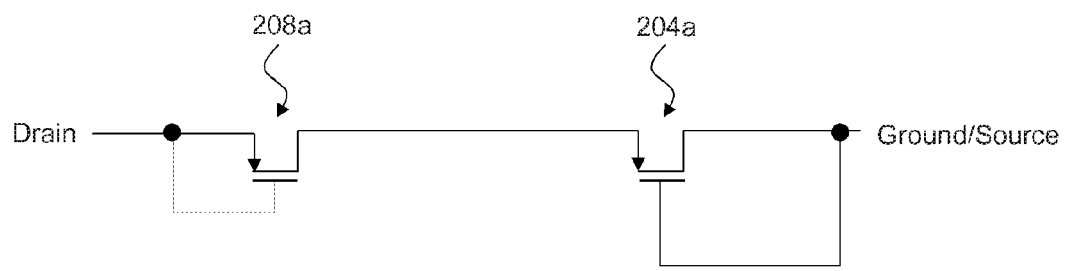
FIG. 2C is an equivalent circuit diagram of the dual gate oxide terminated trench MOSFET described in FIG. 2B-1 and FIG. 2B-2.

FIG. 2C is an equivalent circuit diagram of the dual gate oxide terminated trench MOSFET depicted in FIG. 2B-2. These structures are formed in a semiconductor substrate which may include an n-epitaxial (epi) layer 211 over a bottom n+ substrate layer 214. As shown in the circuit diagram, a parasitic p-channel (in the case of an n-channel device) transistor 204a may be formed under the gate runners 204, from p-body regions 212 in the active area 210 (which is at device source potential) acting as the parasitic drain of the parasitic transistor 204a, the p-body region on the other side of the gate runner 204 acting as the parasitic source of the parasitic transistor 204a, and the portion of the n-epi layer 211 surrounding the gate runner 204 acting as the parasitic channel region of the parasitic transistor 204a. Note that if the device 200 is an n-channel MOSFET, the parasitic transistors are p-channel transistors, so the device drain potential is the parasitic transistor source potential and vice-versa. The parasitic drain of parasitic transistor 204a is at device source potential so a parasitic gate (gate electrode in gate runner 204) is shorted to the device drain potential can turn on the parasitic transistor 204a. When the MOSFET device 200 is turned off, all gate runners 204 go toward the device source potential and can turn on the parasitic transistor 204a. This can allow the device source potential from the active area 210 to short to the drain potential at the die edge 213 and cause leakage.

To overcome this problem, a termination trench 208 can be formed at a periphery of the device, between the die edge 213 and the gate runner 204. A p-channel parasitic transistor 208a is also formed under the termination trench 208. However, the gate electrode in the termination trench 208 is shorted by the termination metal 254 to the parasitic source side (die edge 213 side) of the parasitic transistor 208a, so the parasitic transistor 208a never turns on, thus acting as a channel stop to prevent shorting from the device source to the die edge 213. It is noted that a parasitic transistor is not shown for the gate runner contact trench 206 because the contact trench 206 does not surround the active area 210. If desired, an additional channel stop can be added by forming another termination structure between the first termination structure 208 and the gate runner 204, which in essence adds another always-off parasitic transistor between the first always-off parasitic transistor 208a and parasitic transistor 204a; this improves the voltage capability of the channel stop.

A channel stop can also be formed in other ways, such as those described in commonly-assigned U.S. patent application Ser. No. 12/731,112, which has been incorporated herein by reference above. For example, a channel stop can be made by forming the gate runner trench 204 deep enough to reach the heavily doped bottom substrate 214 (as shown by the dashed lines in FIG. 2B-2). Alternatively, a channel stop may be formed by forming a heavily doped n region at the bottom of the gate runner trench 204. If an alternative channel stop is formed, the termination structure 208 may be omitted. The gate runner trench 204 surrounds the active area and has sufficiently thick gate oxide to support the blocking voltage.

The blocking voltage is the voltage between the two main current carrying terminals of the device e.g. the source to drain voltage. The thicker gate oxide, e.g. the oxide of the gate runner trench or the termination trench, should be thick enough to support the blocking voltage when the device is in the off state (i.e., when the gate is turned off). In other words, the oxide is thick enough that the blocking voltage is not large enough to produce an electric field across the oxide that exceeds the breakdown field for the oxide. Ideally the breakdown voltage of the termination region will be higher than the breakdown voltage of the active area, to improve the robustness of the device.

Figure 3A:
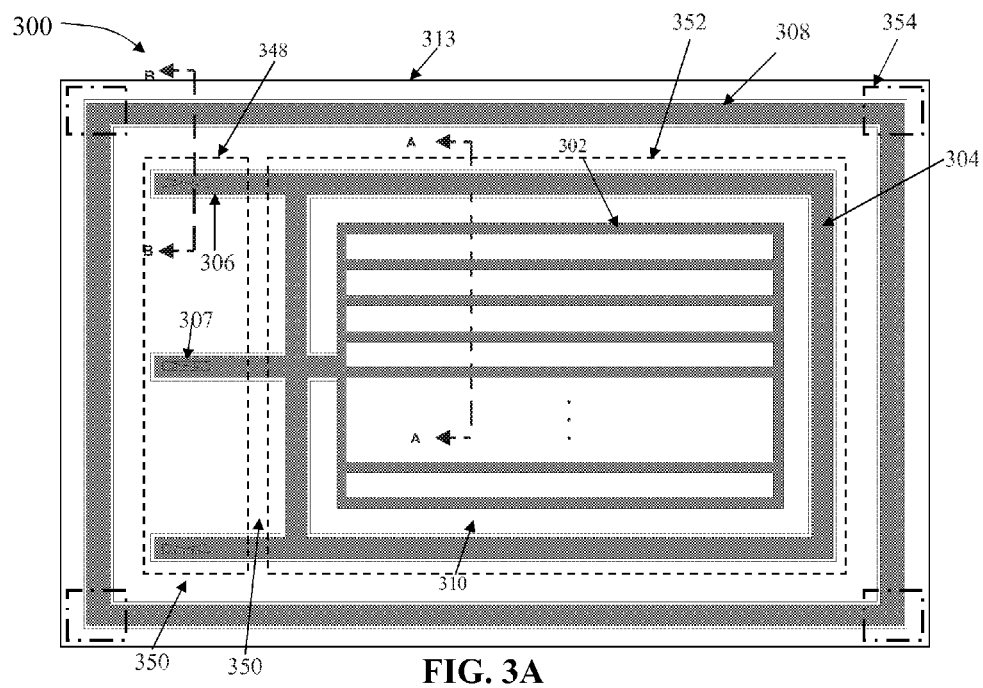
FIG. 3A is a top view of a layout of the dual gate oxide trench MOSFET of the second embodiment of the present invention.
Figure 3B:
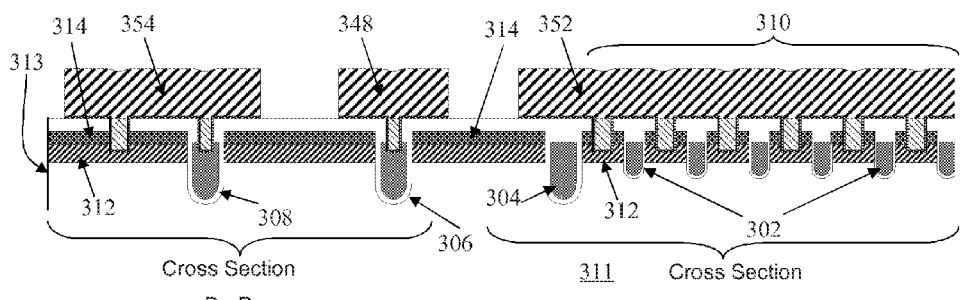
FIG. 3B is a cross-sectional view of the dual gate oxide trench MOSFET described in FIG. 3A along the lines A-A and B-B.
Figure 5A:
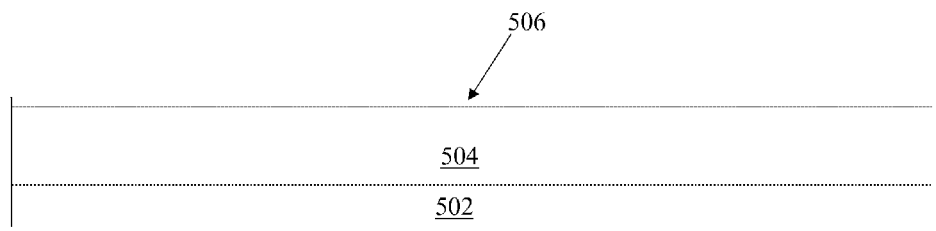
FIGS. 5A-5Q are cross-sectional views illustrating the steps of making the dual gate oxide trench MOSFET described in FIGS. 3A-3B of the second embodiment of the present invention.
Figure 5B:
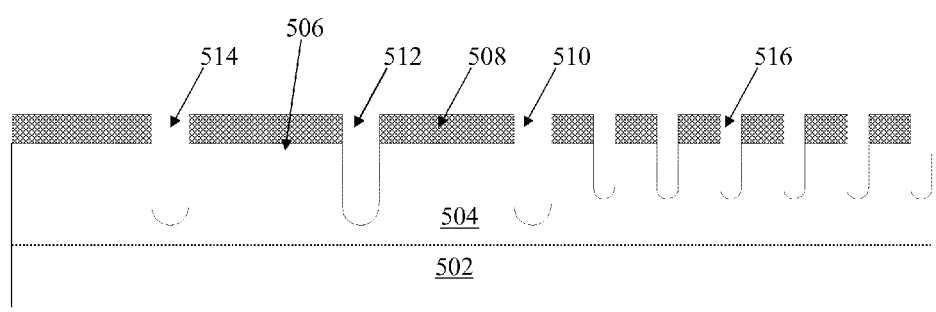

FIG. 3A is a top view of a layout of the dual gate oxide trench MOSFET 300 of a second embodiment of the present invention and FIG. 3B is a cross-sectional view of the dual gate terminated trench MOSFET 300 along the lines A-A and B-B. The dual gate oxide trench MOSFET 300 is similar to the dual gate oxide trench MOSFET 200 as described in FIGS. 2A-2B. As shown in FIGS. 3A-3B, the trench MOSFET 300 includes active gate electrodes formed in active gate trenches 302 located in an active cell area 310. The active gate electrodes are electrically connected to gate runners 304 and 306 formed in wider trenches lined with a thicker oxide. The gate runners include a portion 304 that comes up to and surrounds the active cell area 310, and a portion 306 that connects to a gate metal 348 through contacts 307. A termination structure 308 surrounds the gate runners 304, 306 and the active area 310. The termination structure 308 is electrically connected to a source layer 314 and body layer 312 near the die edge 313 through a termination metal 354 and suitable contacts. The gate metal 348 and source metal 352 are electrically isolated from each other, e.g., by a gap 350, which may be filled with an insulating material. A source metal covers the active area 310 and the surrounding gate runners 304. The shorted termination structure 308 acts as a channel stop, as explained above. In this embodiment, the n-type source layer 314 can be formed on a top portion of a p-body layer 312 in the active cell area 310 and in the termination area, and both source and body are formed over an n-type drift/epitaxial layer 311. The dual gate oxide trench MOSFET 300 may be formed using a three mask process as shown in FIGS. 5A-5Q.

Figure 3C:
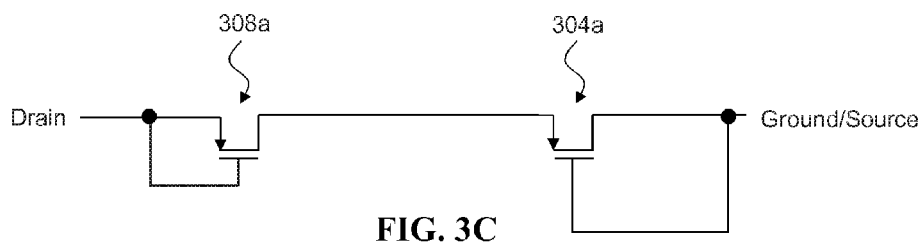
FIG. 3C is circuit diagram of the dual gate oxide terminated trench MOSFET described in FIG. 3B.

FIG. 3C is an equivalent circuit diagram of the dual gate oxide terminated trench MOSFET described in FIG. 3B. As shown in the circuit diagram, the parasitic p-channel transistor 304a is formed under the gate runner trench 304 and but is mitigated by the termination trench 308 acting as a channel stop. The parasitic transistor 308a located under termination trench 308 has its parasitic source shorted to its parasitic gate by the termination metal 354, thus preventing it from turning on as explained above.

Figure 4A:
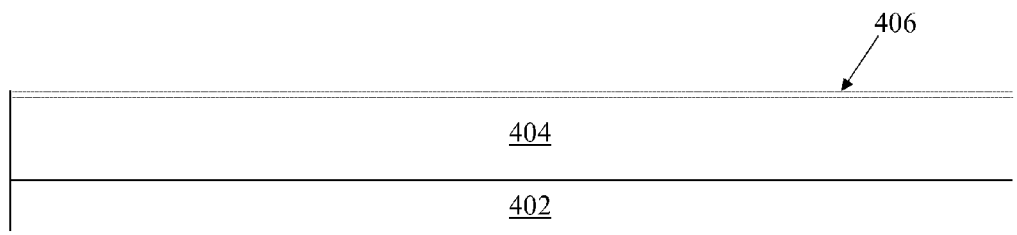
FIGS. 4A-4R are cross-sectional views illustrating the steps of making the dual gate oxide trench MOSFET described in FIGS. 2A-2B of the first embodiment of the present invention.
Figure 4B:
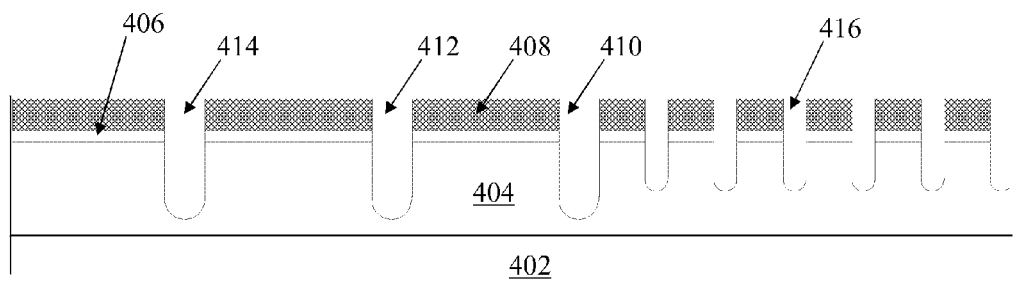
Figure 4C:
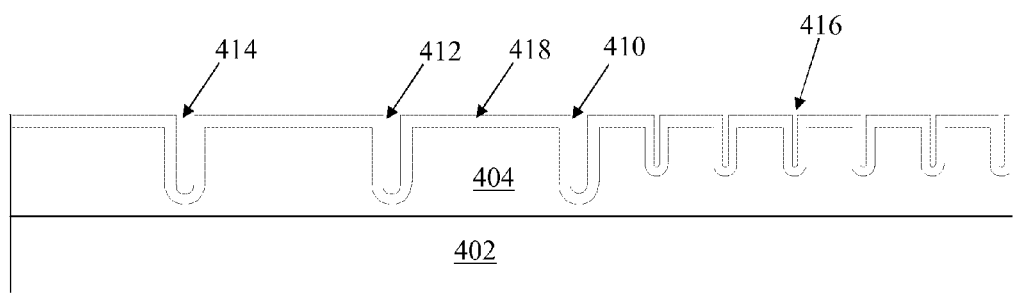
Figure 4D:
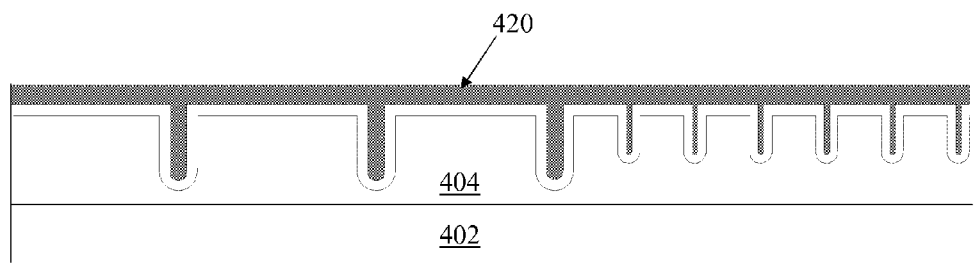
Figure 4E:
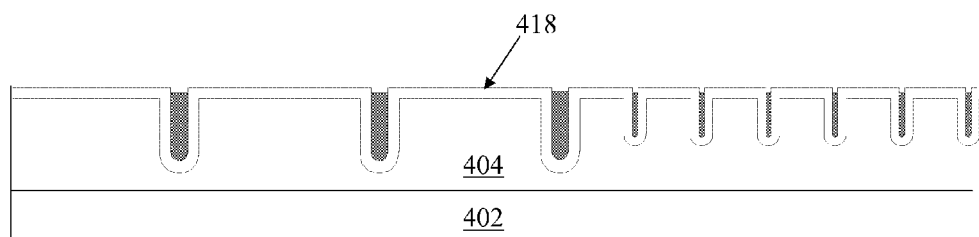
Figure 4F:
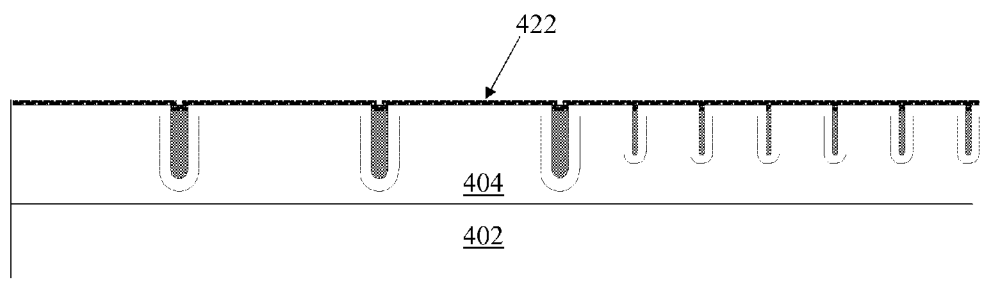
Figure 4G:
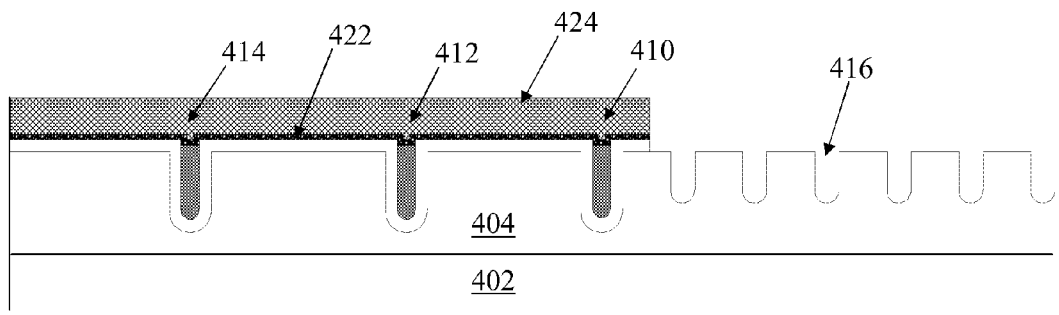
Figure 4H:
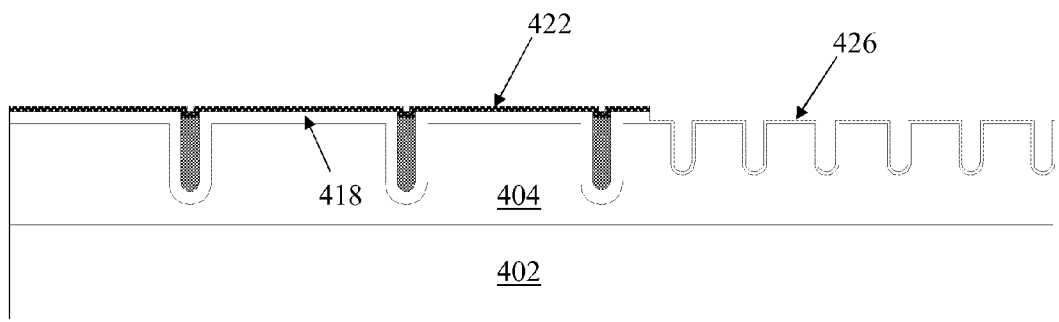
Figure 4I:
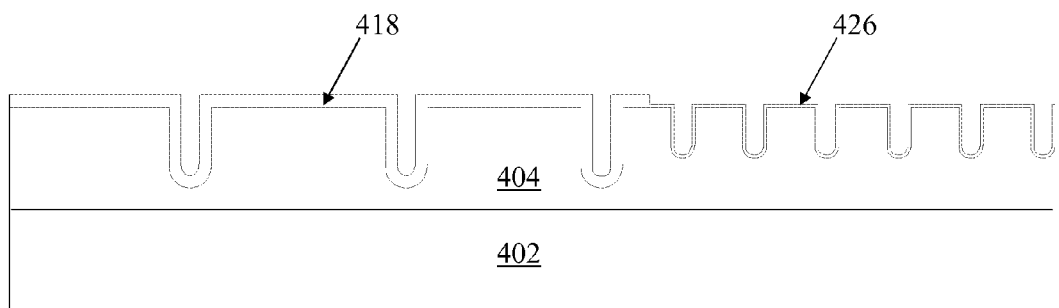
Figure 4J:
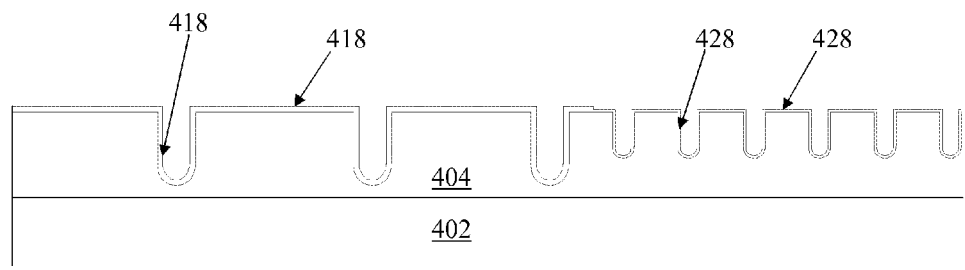
Figure 4K:
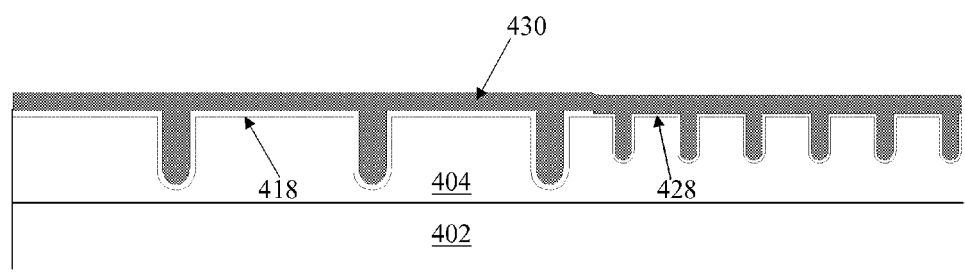
Figure 4L:
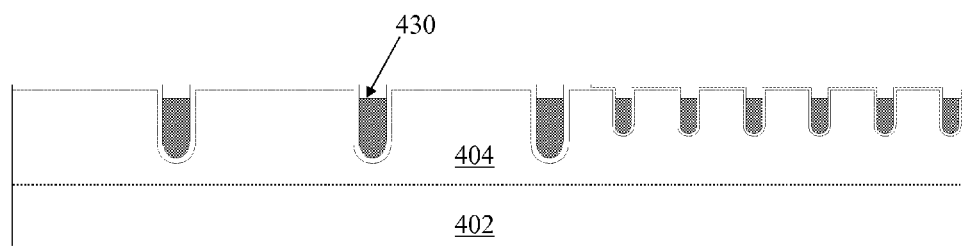
Figure 4M:
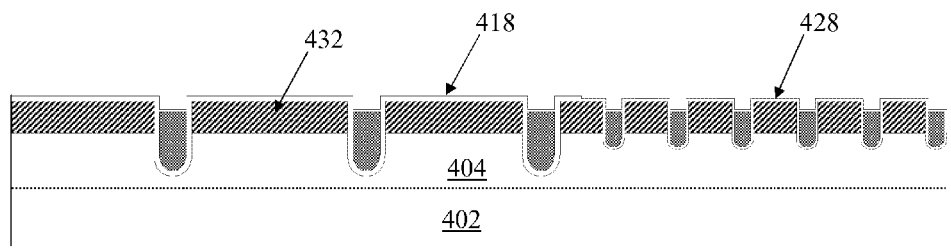
Figure 4N:
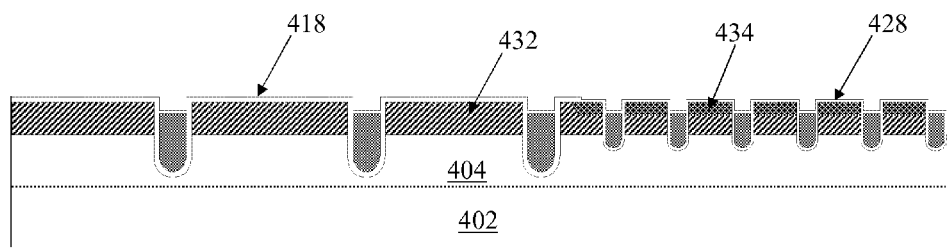
Figure 4O:
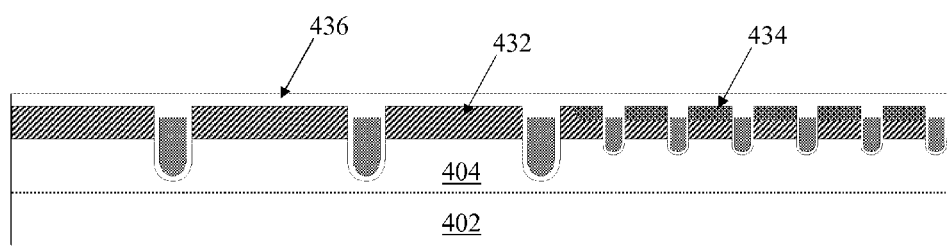
Figure 4P:
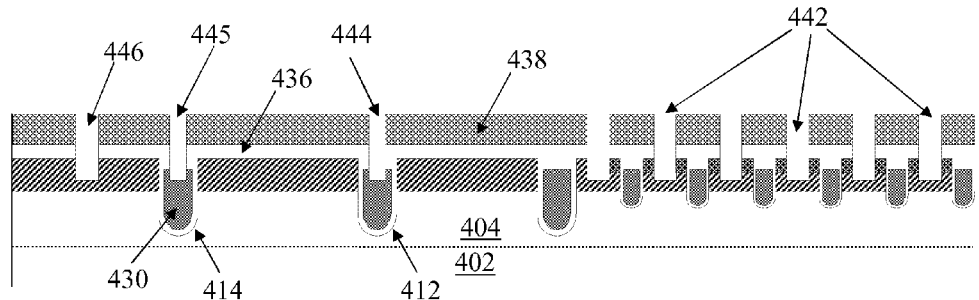
Figure 4Q:
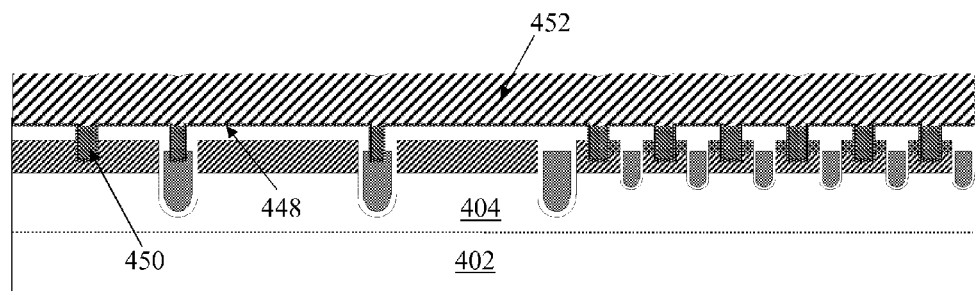
Figure 4R:
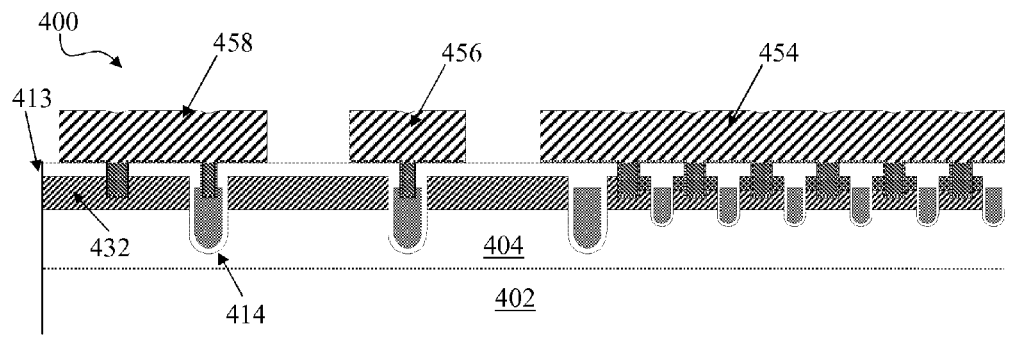

FIGS. 4A-4R are cross-sectional views illustrating a four mask method for making a dual gate oxide trench MOSFET of the type depicted in FIGS. 2A, 2B-1 and 2B-2 as described above. As shown in FIG. 4A, a starting material in the form of a semiconductor substrate includes e.g., a relatively lightly doped (e.g., n−) epitaxial (epi) layer 404 located on top of a heavily doped (e.g., n+) substrate 402. Alternatively, the epi layer may be doped p− and the substrate doped p+. An initial insulating layer 406 may be formed on a top surface of the epi layer 404. By way of example and not by way of limitation the insulating layer 406 may be an oxide formed, e.g., by a combination of thermal oxidation and deposition of low temperature oxide or high density plasma (HDP). As shown in FIG. 4B, a first mask 408, referred to herein as a trench mask, is applied on top of the insulating layer 406 and patterned with openings that correspond to trenches to be formed. Trenches 410, 412, 414 and 416 can be formed by etching through the insulating layer 406, the layer 404 and a top portion of the epi layer 404. Trenches 410 and 412 can be used to form first and second gate runners later in the process. For convenience the trenches 410, 412 are referred to herein as first and second gate runner trenches. Another trench 414 may be used to form part of a termination for the active region. For convenience, this trench 414 is referred to as a termination trench. Trenches 416 can be used to form active device cells. For convenience, these trenches 416 are referred to herein as active trenches. The trenches can be etched to different depths in a common etch step if the trenches have different widths. For example, the gate runner trenches 410, 412, and termination trench 414 can be made wider than the active trenches 416 so that the gate runner trenches 410, 412, and termination trench 414 can be etched to a greater depth than the active trenches 416 by the same etch process. This permits the use of a single mask to etch all of the trenches.

As shown in FIG. 4C, the first mask 408 is removed. A thick gate insulator layer 418 (e.g., an oxide) is deposited or otherwise formed on the bottom and sidewall of the trenches 410, 412, 414 and 416 and on top of the epi layer 404. A thickness of the thick gate oxide layer 418 is between about 800 Å and about 1500 Å. A sacrificial material 420 is deposited into the trenches 410, 412, 414, and 416 and on top of the epi layer 404 as shown in FIG. 4D. By way of example, and not by way of limitation, the sacrificial material may be an electrically conductive or semiconductive material, such as polycrystalline silicon (polysilicon). The sacrificial material 420 can be etched back with an endpoint of the etching below the top surface of the gate insulator layer 418 and above the top surface of the epi layer 404 as shown in FIG. 4E. Sacrificial material 420 remains filling the trenches 410, 412, 414, and 416.

A thin oxygen diffusion barrier layer 422 (e.g., nitride) is deposited on top of the sacrificial material 420 in the trenches 410, 412, 414 and 416 and on top of the gate insulator layer 418 as shown in FIG. 4F. By way of example, a thickness of the thin nitride layer 422 is between about 200 Å and about 500 Å.

A second mask 424, i.e. the gate oxide mask is applied on top of the thin nitride layer 422. As shown in FIG. 4G, the gate oxide mask 424 only covers trenches 410, 412, 414 located in the gate runner area and termination area, but not the active trenches 416. Sacrificial material 420 ensures photomask material is not deposited inside the trenches, which can be difficult to remove. Portions of the thin nitride layer 422 that are not covered by the second mask 424 are etched away followed by the etching of the sacrificial material 420 in the trenches 416. The thick gate insulator layer 418 in the trenches 416 and on top of the epi layer 404 layer that are not covered by the second mask 424 are also etched away.

The second mask 424 is then removed followed by forming, e.g. growing, a thin sacrificial insulator 426, e.g. oxide, into the sidewall and the bottom of the active trenches 416 and on top of the n-epi layer 404 layer as shown in FIG. 4H. Preferably the sacrificial insulator is made of a material that is not formed (e.g., grown) on the material of the thin nitride layer 422. By way of example, the thin nitride layer 422 may be made of a nitride material (e.g., silicon nitride) and the thin sacrificial insulator layer 426 may be made of a grown oxide material (e.g., silicon oxide). A thickness of the sacrificial insulator 426 can be between about 200 Å and about 500 Å.

The remaining portion of the thin nitride layer 422 is stripped as shown in FIG. 4I. The sacrificial material 420 in the trenches 410, 412, 414 is then etched away. The thin oxygen diffusion barrier layer 422 can be made of material that is resistant to a process that etches the material of the sacrificial insulator layer 426. In addition, the thin oxygen diffusion barrier layer 422 may be made of a material that can be etched by a process to which the sacrificial insulator layer 426 is resistant.

The sacrificial insulating 426, which is thinner than the thick gate insulator layer 418, can be removed from active trenches 416, while leaving the thick gate insulating layer 418 intact as shown in FIG. 4J. A thin gate insulator 428 can then be formed in the bottom and sidewalls of the active trenches 416. A thickness of the thin gate insulator 428 may be between about 150 Å and about 500 Å.

As shown in FIG. 4K, a conductive material 430 (e.g., polysilicon) can be deposited into all the trenches 410, 412, 414 and 416 and can also overflow on top of the thick gate insulator 418 and thin gate insulator 428 over the epitaxial layer 404. The conductive material 430 can then be etched back with an endpoint below the top surface of the epi layer 404 as shown in FIG. 4L.

As shown in FIG. 4M, a body layer 432 can be formed at a top portion of the epi layer 404. The body layer 432 may be formed, e.g., by vertical or angled blanket implantation and diffusion of dopants of an opposite conductivity type to that of the epi layer 404 and substrate 402. For example, if the substrate 402 and epi layer 404 are n-type doped, the body layer 432 may be formed by implantation of p-type dopants and vice versa. The body implant can be performed at a sufficiently high energy, e.g. 80-120 KeV, that the thick gate insulator 418 does not block the body implantation.

A source layer 434 can be formed at a top portion of the body layer 432 by a low energy implantation process as shown in FIG. 4N. If the source implant is performed at a sufficiently low energy, e.g., about 20 KeV, and the thick gate insulator is sufficiently thick (e.g., oxide about 1200 Å thick) dopants are implanted only at the active cell area because the thick gate insulator 418 blocks the implantation and the thin gate oxide 428 is thin enough for the ions to penetrate. The source layer 434 may be formed, e.g., by vertical or angled implantation and annealing. The source layer 434 is generally formed by implanting dopants of an opposite type conductivity type to the body dopants. The source and body implants may be performed without the use of additional masks.

As shown in FIG. 4O, an insulator layer 436 is formed on top of the structure followed by densification and planarization. Planarization may be accomplished through chemical mechanical planarization (CMP). By way of example, and not by way of limitation, the insulator layer 436 may be a low-temperature oxide and borophosphosilicate glass (BPSG).

As shown in FIG. 4P, a contact mask 438 is formed on the insulator layer 436 and patterned with openings that define contact holes. The contact mask 438 is the third mask used in this process. The insulator layer 436, the source layer 434 and portions of the body layer 432 in the active cell area may be etched through the openings in the mask 438 to form source/body contact holes 442. The insulator layer 436 and a portion of the conductive material 430 in the trenches 412, 414 are etched down to form gate contact holes 444 and termination contact holes 445. The insulator layer 436 and a top portion of the body layer 432 located at the edge of the termination area and proximity to the trench 410 can be etched down to form a termination short contact hole 446.

As shown in FIG. 4Q, a layer 448 of a barrier material, such as Ti/TiN, may be deposited into the contact holes 442, 444, 445 and 446. A conductive (e.g., tungsten (W)) plug 450 may then be used to fill up the contact holes 442, 444, 445 and 446.

The barrier metal 448 and tungsten plug 450 in the contact holes 442 in the active area provide source/body contacts. The barrier metal 448 and tungsten plug 450 in the contact holes 444 over the gate contact trench 412 provide gate contact. The barrier metal 448 and tungsten plug 450 in the contact holes 445, 446 in the termination region form contacts to short the termination trench electrode to the body region near the die edge. A metal layer 452, preferably Al—Si, may then be deposited on top of the resulting structure.

A patterned metal mask (not shown) is deposited on the metal layer 452 following with a metal etch to separate the metal layer 452 into electrically isolated portions that form gate, termination and source metals such as gate metal 456, termination connection metal 458 and source metal 454 to form a device 400 similar to the semiconductor device 300 of FIGS. 2A, 2B-1 and 2B-2 to complete the device. The metal mask is the fourth photomask in this process. The barrier metal 448 and tungsten plug 450 in the contact holes 442 over the source regions provide source/body contacts from the source layer 434 and body layer 432 to the source metal 454. The barrier metal 448 and tungsten plug 450 in the contact holes 444 form over gate runner region provide vertical gate runner contacts from the gate runner to the gate metal 456. The barrier metal 448 and tungsten plug 450 in the contact holes 445, 446 and the termination metal 458 short the gate of the termination trench 414 to the body region 432 between the die edge 413 and the termination trench 414.

FIGS. 5A-5Q are cross-sectional views illustrating a three masks method for making the dual gate oxide trench MOSFET of the type depicted in FIGS. 3A-3B as described above. The method for making the dual gate oxide trench MOSFET 300 only requires three masks: a trench mask, a contact mask and a metal mask. In this method, the gate oxide mask of FIGS. 4A-4R can be eliminated.

As shown in FIG. 5A, a semiconductor substrate that includes e.g., a relatively lightly doped (e.g., n−) epitaxial (epi) layer 504 located on top of a heavily doped (e.g., n+) substrate 502 is provided. An oxide layer 506 may be formed on a top surface of the n-epi layer 504. By way of example, an oxide may be formed by a combination of thermal oxidation and deposition of low temperature oxide or high density plasma (HDP). A first mask 508, which is a trench mask, patterned with openings that define trenches, is applied on top of the oxide layer 506 as shown in FIG. 5B. Trenches 510, 512, 514 and 516 are formed by etching through the oxide layer 506, the epi layer 504 and a top portion of the n+ substrate 502. Trenches 510 and 512 can be used to form first and second gate runners later in the process. For convenience these trenches 510, 512 are referred to as first and second gate runner trenches. Another trench 514 may be used to form part of a termination structure. For convenience, this trench 514 is referred to as a termination trench. Trenches 516 can be used to form active device cells. For convenience, the trenches 516 are therefore referred to as active trenches. The gate runner trenches 510, 512 and termination trench 514 can be made wider that the active trenches 516 so that the gate runner trenches 510, 512, and termination trench 514 are etched deeper than the active trenches 516 even though all are etched during the same etch process.

Figure 5C:
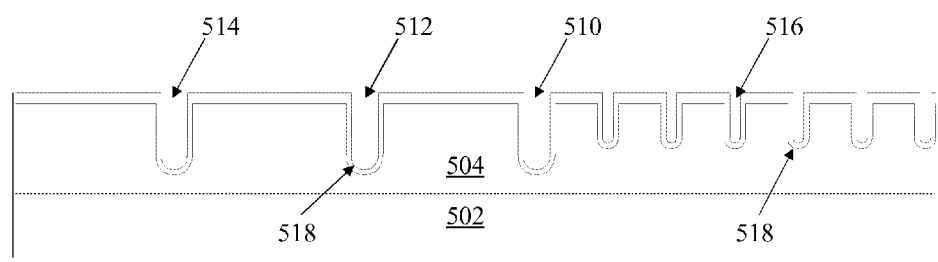
Figure 5D:
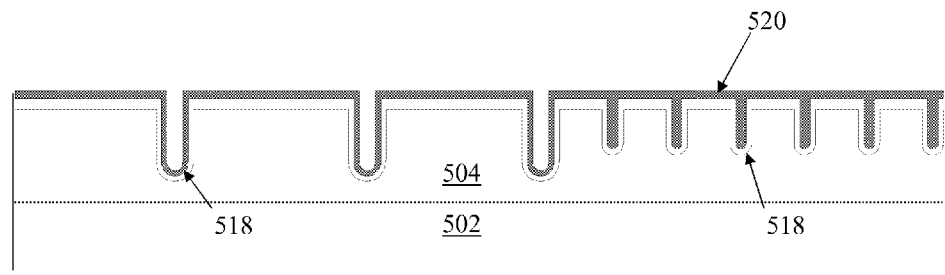
Figure 5E:
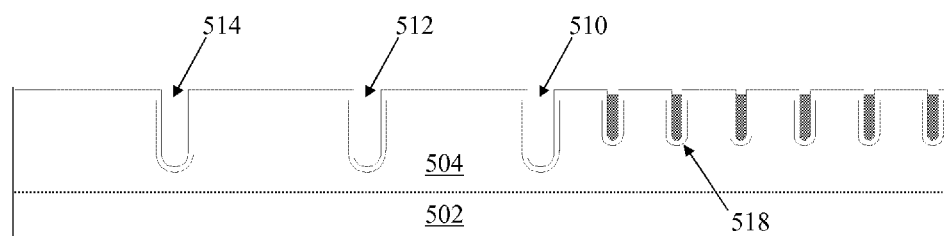

As shown in FIG. 5C, the first mask 508 is removed. A gate insulator layer 518 (e.g., an oxide) is formed on the bottom and sidewall of the trenches 510, 512, 514 and 516 and on top of the epi layer 504. A thickness of the gate insulator layer 518 is between about 500 Å and about 1000 Å. Sacrificial material 520 (e.g., polysilicon) is deposited to fill up the active trenches 516 and deposited on top of the epi layer 504 as shown in FIG. 5D. The gate runner trenches 510, 512 and termination trench 514 are sufficient wide compared to the active trenches 516 that the sacrificial material 520 only lines the bottom and sidewall of the trenches 510, 512, 514 without filling up these trenches. The sacrificial material 520 can then be isotropically etched back with the endpoint of the etching in the active trenches 516 being below the top surface of the thick gate insulator layer 518 and above the top surface of the epi layer 504. The sacrificial material 520 can be completely removed from the gate runner trenches 510, 512, and termination trench 514 and as shown in FIG. 5E. At this point, a channel stop can be formed at the bottom of gate runner trenches 510, 512, e.g. by anisotropic implantation. By way of example, and not by way of limitation, the channel stop can be n+ doped for an n-channel MOSFET device.

Figure 5F:
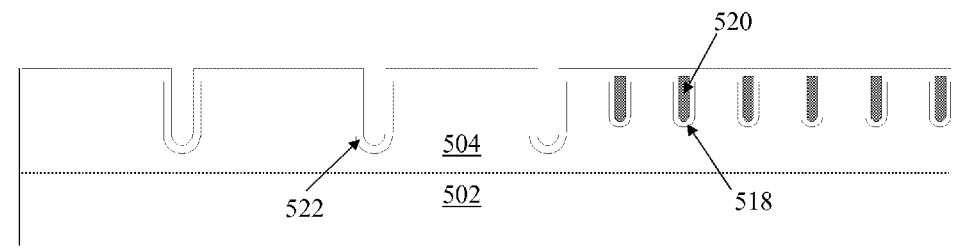
Figure 5G:
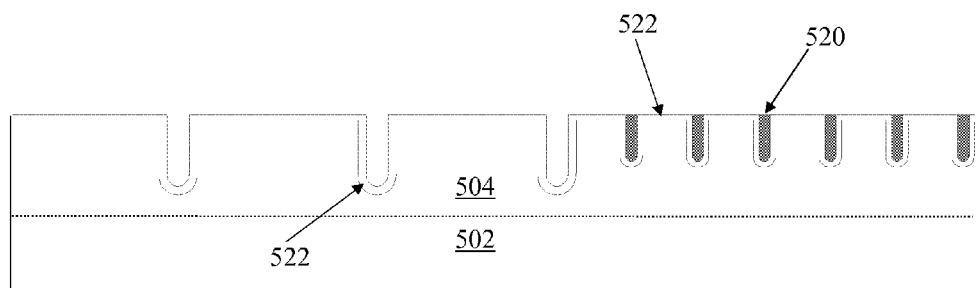
Figure 5H:
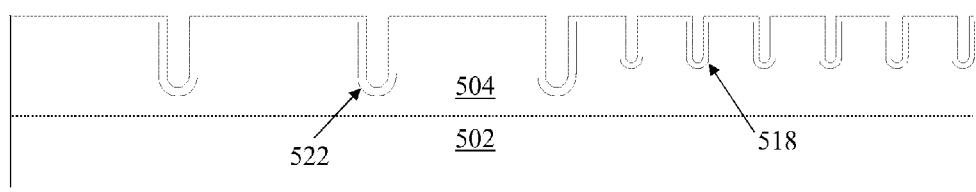

Insulating material is then deposited on the bottom and sidewall of the trenches 510, 512, 514 and on top of the gate insulator 518 to form a thicker insulator layer 522 as shown in FIG. 5F. In general, the insulating material may be the same type of material as the gate insulator 518. By way of example, if the gate insulator 518 is an oxide, the insulating material may be formed by oxidation deposition, e.g., high temperature oxidation (HTO) deposition. Thus a thicker gate insulating layer 522 is formed in trenches 510, 512, 514 while a thinner gate insulating layer 518 is formed in active trenches 516. A planarization, e.g., CMP can then be performed on the surface so that the top surface of the insulator 522 is even with the surface of the sacrificial material 520 in the trenches 516 to expose the sacrificial material 520 as shown in FIG. 5G. The sacrificial material 520 is then etched away from the trenches 516 as shown in FIG. 5H. At this stage, the thickness of the oxide layer in the sidewall and bottom of the trenches 516, e.g., between 500 Å and 1000 Å, is less than the thickness of the oxide layer in the sidewall and the bottom of the trenches 510, 512, 514, e.g., between 1500 Å and 2000 Å.

Figure 5I:
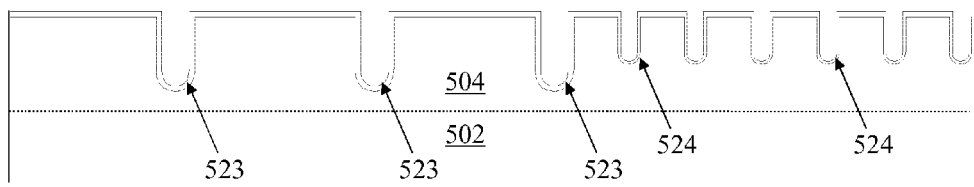

The insulator 518 and 522 may then be thinned, e.g., by an isotropic etch to form an active gate insulator 524 in the active trenches 516 as shown in FIG. 5I and a thicker gate insulator 523 in gate runner trenches 510, 512 and termination trench 514. Preferably, a brief etch is performed to completely remove the insulator layer 518 from the active trenches 516 while keeping the thicker insulator layer 522 in trenches 510, 512, 514 mostly intact; then, a thin active gate insulator layer 524 may be formed (e.g. grown) in the active trenches 516 while leaving a thicker gate insulator 523 in trenches 510, 512, 514. Thus the device can be said to have dual gate insulator thicknesses. A thickness of the active gate insulator 524 is between about 150 Å and about 800 Å, while a thickness of the thicker gate insulator 523 is between about 500 Å and about 1200 Å.

Figure 5J:
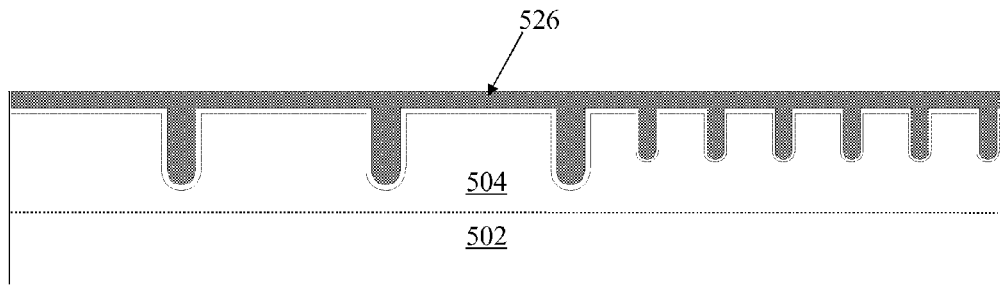
Figure 5K:
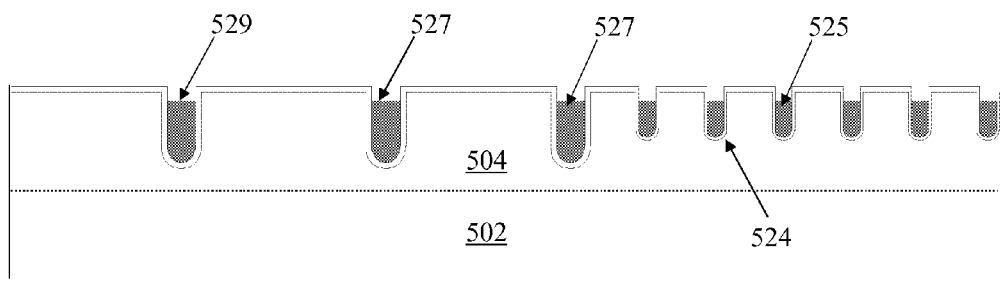

Conductive or semi-conductive material 526 (e.g., polysilicon) can be deposited or otherwise formed to fill up all of the trenches 510, 512, 514 and 516 and on the top surfaces as shown in FIG. 5J. If necessary, the conductive material 526 may be doped to make it more conductive. The conductive material 526 can then be etched back with an etch endpoint below the top surface of the epi layer 504 to form active gate electrodes 525, gate runners 527 and a termination structure 529 as shown in FIG. 5K.

Figure 5L:
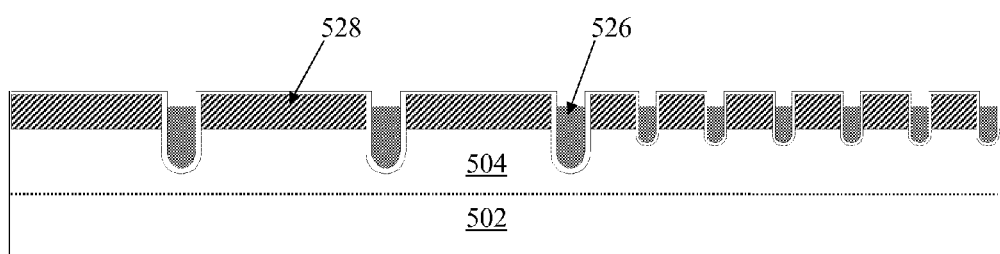
Figure 5M:
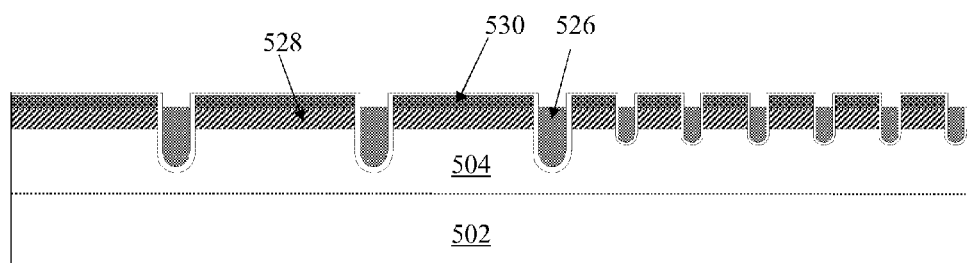

As shown in FIG. 5L, a body layer 528 can be formed at a top portion of the epi layer 504. The body layer 528 may be formed, e.g., by vertical or angled blanket implantation and diffusion of suitable dopants, e.g., as described above with respect to FIG. 4M. A source layer 530 can be formed at a top portion of the body layer 528 as shown in FIG. 5M. The source layer 530 may be formed, e.g., by vertical or angled implantation of suitable dopants followed by annealing, e.g., as discussed above with respect to FIG. 4N.

Figure 5N:
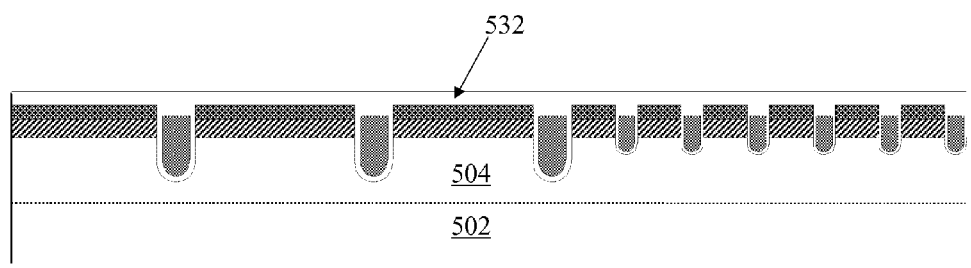

As shown in FIG. 5N, an insulator layer 532, e.g., a low temperature oxide and a borophosphosilicate glass (BPSG), can be formed on top of the structure followed by densification and CMP planarization.

Figure 5O:
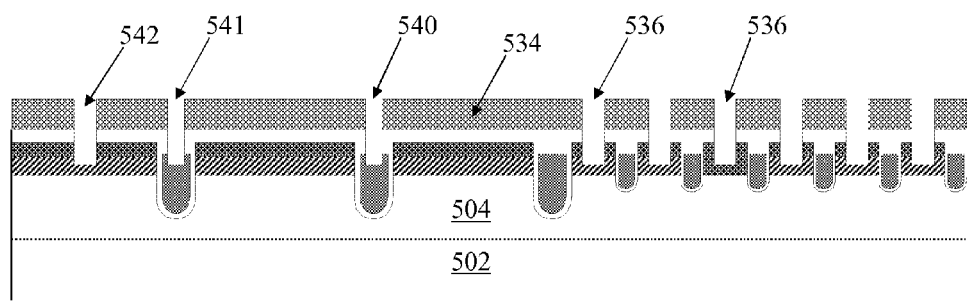

As shown in FIG. 5O, a contact mask 534 is formed on the insulator layer 532 and patterned with openings that define contact holes. It is noted that the contact mask 534 is only the second photomask used in this process up to this point. The insulator layer 532, the source layer 530 and portions of the body layer 528 in the active cell area may be etched through the openings in the mask to form source contact holes 536. The insulator layer 532 and a portion of the material 526 in the trenches 512, 514 can be etched down to form a gate runner contact hole 540 and a termination contact hole 541. The insulator layer 532, the source layer 530 and portions of the body layer 528 positioned at the edge of the termination area and proximate to the trench 514 is etched down to form termination short contact hole 542.

Figure 5P:
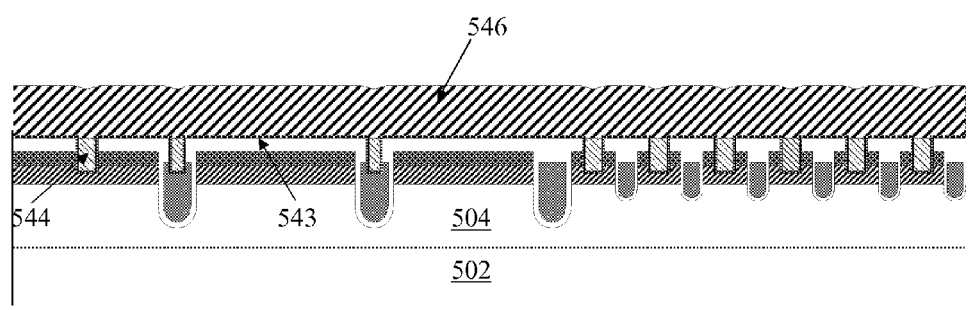
Figure 5Q:
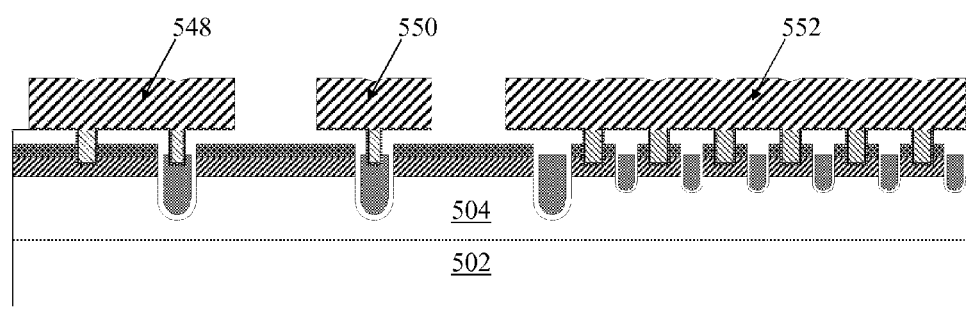

As shown in FIG. 5P, a layer 543 of a barrier material, such as Ti/TiN, may be deposited into the contact holes 536, 540, 541 and 542 and on top of the oxide 532. A conductive (e.g., tungsten (W)) plug 544 may then be used to fill up the contact holes 536, 540, 541 and 542. The barrier metal 543 and tungsten plug 544 in the contact holes 536 over the source regions 530 provide source/body contacts in the active cell area. The barrier metal 543 and tungsten plug 544 in the contact holes 540 over the gate contact area or termination area provide gate contact. The barrier metal 543 and tungsten plug 544 in the contact holes 541, 542 provide contact for a termination/channel stop short. A metal layer 546, preferably Al—Si, may then be deposited on top of the resulting structure, as shown in FIG. 5P.

A patterned metal mask (not shown) is deposited on the metal layer 546 following with a metal etch to separate the metal layer 546 into electrically isolated portions that form electrically isolated metal regions including a gate metal region 550 and a source metal region 552 and a termination metal region 548 of the semiconductor device 300 of FIGS. 3A-3B to complete the device. The metal mask is the third photomask in this process. The barrier metal 543 and tungsten plug 544 in the contact holes 536, 538 over the source regions provide source/body contacts from the source layer 534 and body layer 532 to the source metal 552. The barrier metal 543 and tungsten plug 544 in the contact holes 540 over gate runner region provide vertical gate runner contacts from the first and second gate contacts to gate metal 550. The barrier metal 543 and tungsten plug 544 in the contact holes 541, 542 over termination/channel stop region provide contact to the termination metal 548. In this method, the gate oxide mask is eliminated.

Figure 6:
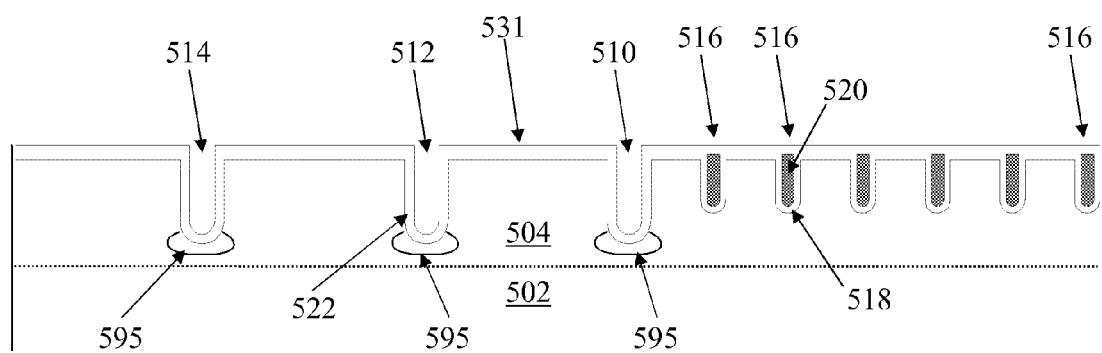
FIG. 6 is a cross-sectional view illustrating a process of making a dual gate oxide trench MOSFET according to an alternative embodiment of the present invention.

In an alternative version of the method, a channel stop region may be formed under the bottom of the gate runner trenches 510, 512 and termination trench 514 after the stage shown in FIG. 5F. As shown in FIG. 6, a blanket channel implant may be performed to form a highly doped channel stop region 595 (of the same conductivity type as the eventual source region) under the trenches 510, 512, 514. By way of example, the channel stop implant can have enough energy to penetrate the trench oxide 522 in the trenches 510, 512, 514 but not enough energy to penetrate the thicker top oxide layer 531 which includes the original trench hard mask 506 from FIGS. 5A-5B. The top oxide layer 531 as well as the polysilicon 520 in active trenches 516 can act as hard masks so that the channel stop regions 595 are only formed under the bottom of the gate runner trenches 510, 512 and termination trench 514.

Alternatively, the trenches 510, 512, 514 could be made deep enough to reach the substrate to act as the channel stop (as shown by the dashed lines in FIG. 6). If a channel stop is formed at trenches 510, 512, then the termination trench 514 may not even be necessary as long as the oxide 522 in gate runner trenches 510, 512 is thick enough to support the blocking voltage.

Figure 7A:
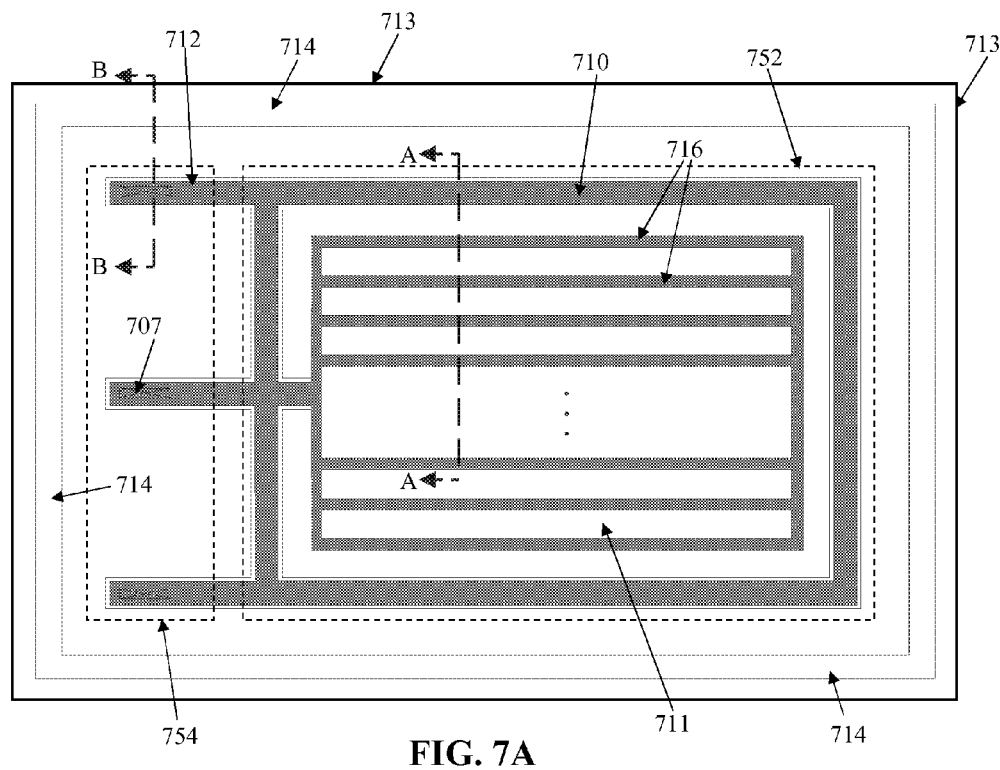
FIG. 7A is a top view of a layout of a dual gate oxide trench MOSFET according to an alternative embodiment of the present invention.
Figure 7B:
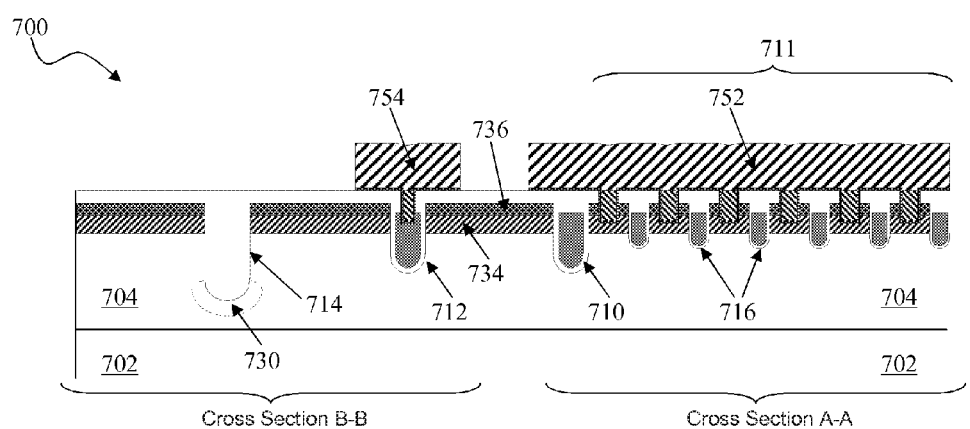
FIG. 7B is a cross-sectional view of the dual gate oxide trench MOSFET described in FIG. 7A along the lines A-A and B-B.

FIGS. 7A-7B shows an alternative structure that combines the dual gate oxide of as described herein with an oxide termination trench as described in U.S. patent application Ser. No. 12/731,112, which has been incorporated herein by reference. FIG. 7A is a top view of a layout of the dual gate oxide trench MOSFET device 700 of an embodiment of the present invention and FIG. 7B is a cross-sectional view of the dual gate oxide MOSFET 700 with oxide termination trench along the lines A-A and B-B. The method for making the oxide termination trench MOSFET 700 only requires three masks: a trench mask, a contact mask and a metal mask, which is described below with respect to FIGS. 8A-8R.

As shown in FIGS. 7A-7B, the trench MOSFET 700 includes gate electrodes formed in oxide lined trenches 716 located in an active cell area 711. Gate runners are formed in a wider set of oxide lined trenches. The gate runners include a first portion 710 that abuts and surrounds the active cell area 711. The gate runners include a second portion 712 that makes contact to a gate metal layer 754 (outline indicated by dashed lines on FIG. 7A) through contacts 707. An oxide termination trench 714 is a trench filled with oxide that surrounds the gate runners 710, 712 and the active area 711. The oxide termination trench 714 has a heavily doped (n+) channel stop region 730 located under the oxide termination trench 714. By way of example, in the embodiment shown in FIG. 7B, an n-type (in the case of an n-channel MOSFET device) source layer 736 might only be formed on a top portion of a p-body layer 734 in the active cell area. A source metal layer 752 makes contact to source/body regions in the active area 711. The gate oxides of the active area gate trenches 716 are much thinner than the gate oxides of gate runner 710, 712. The thick gate oxide of gate runners 710, 712 is thick enough, e.g., about 1000 Angstroms to 2000 Angstroms, to sufficiently support the blocking voltage. Additionally, the oxide termination trench 714, being wide and filled with dielectric material, is wide enough to support a high breakdown field corresponding to the blocking voltage. The device 700 is formed in a semiconductor substrate that can include an n-epitaxial layer 704 formed over a heavily doped bottom substrate 702.

Figure 8A:
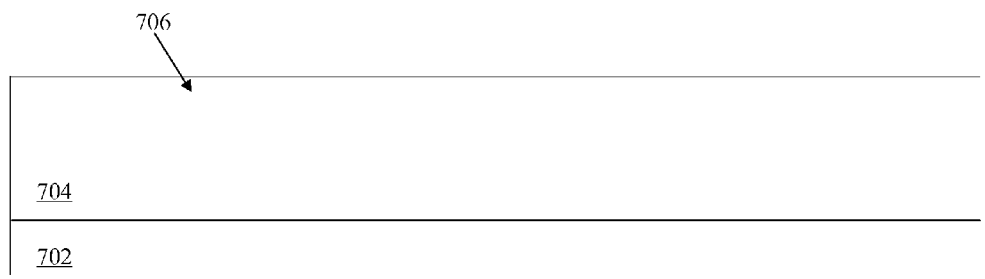
FIGS. 8A-8R are cross-sectional views illustrating a process of making the dual gate oxide trench MOSFET illustrated in FIGS. 7A-7B.
Figure 8B:
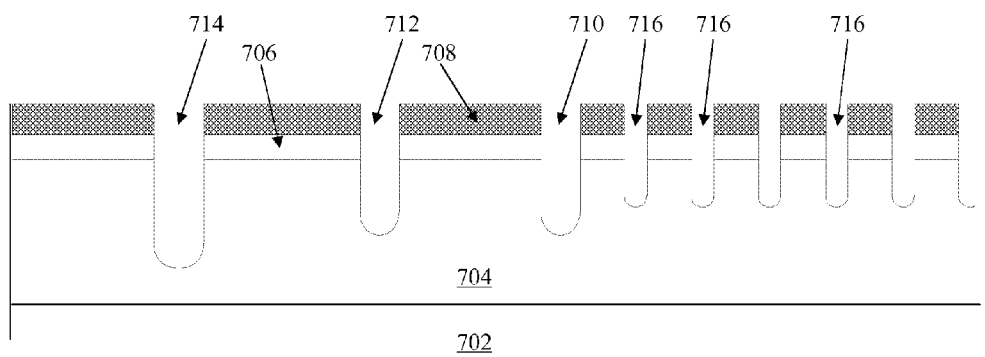
Figure 8C:
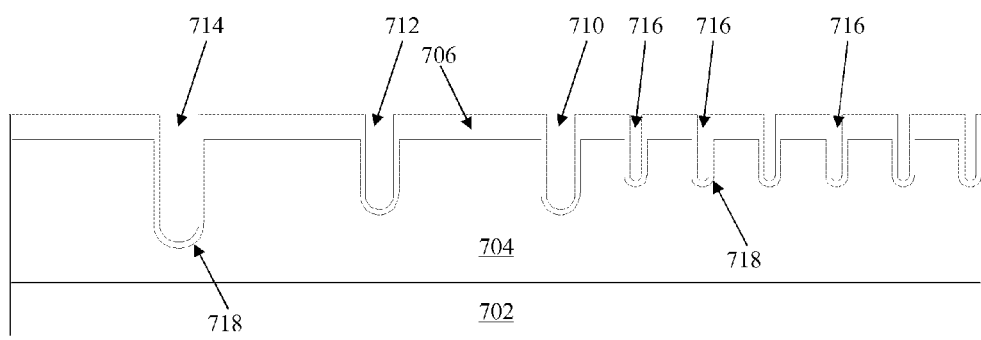
Figure 8D:
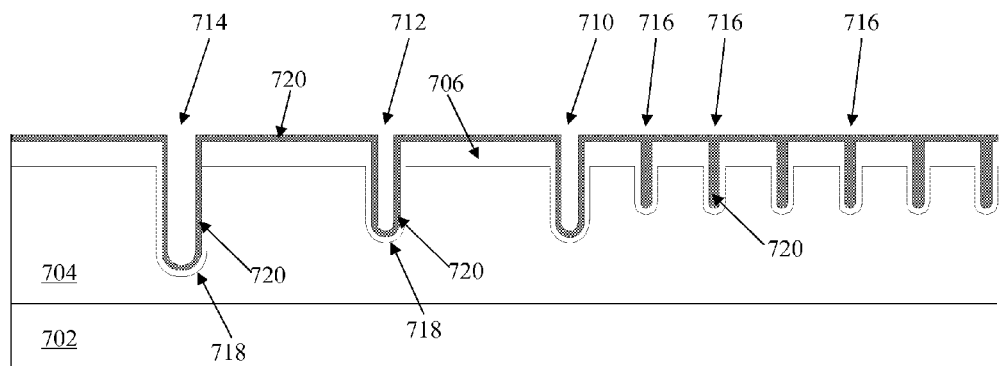
Figure 8E:
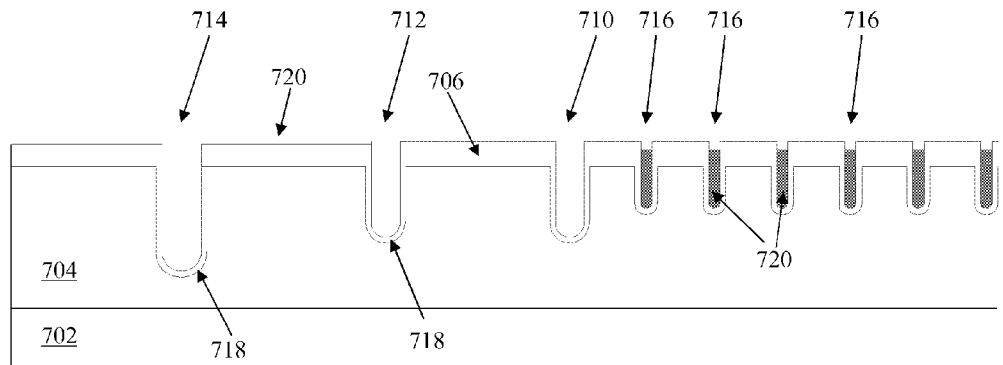
Figure 8F:
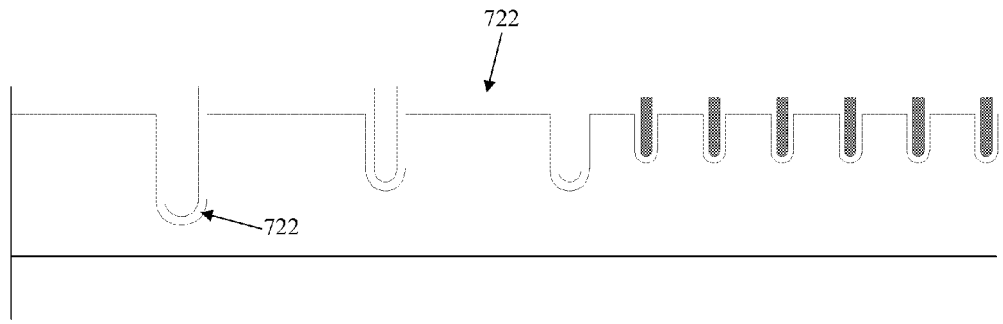
Figure 8G:
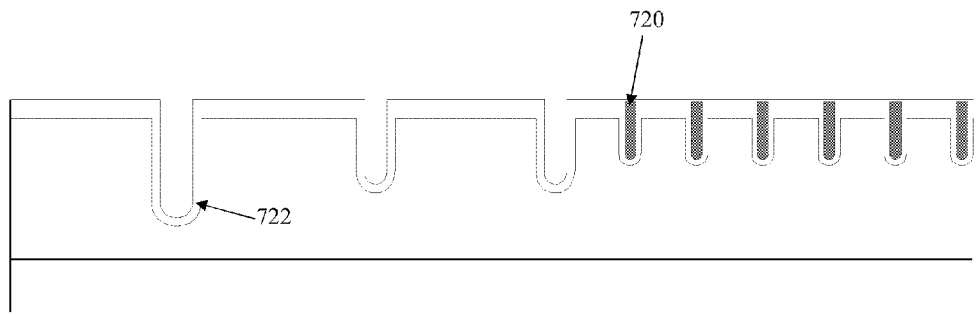
Figure 8H:
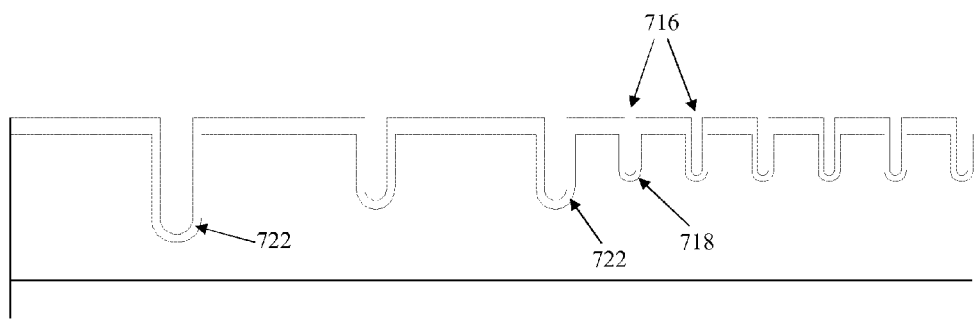
Figure 8I:
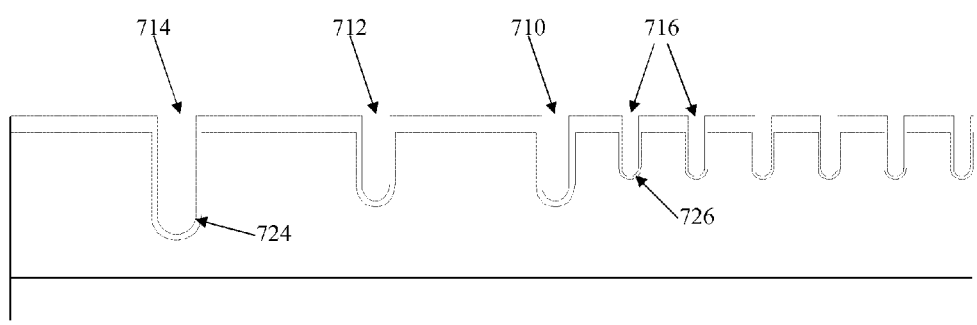
Figure 8J:
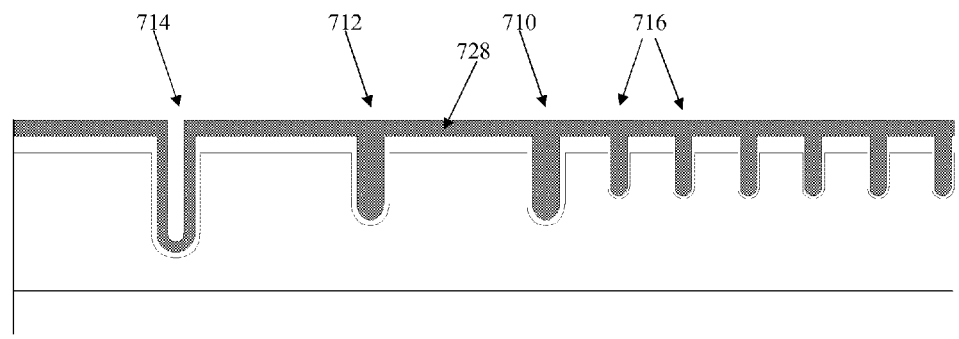
Figure 8K:
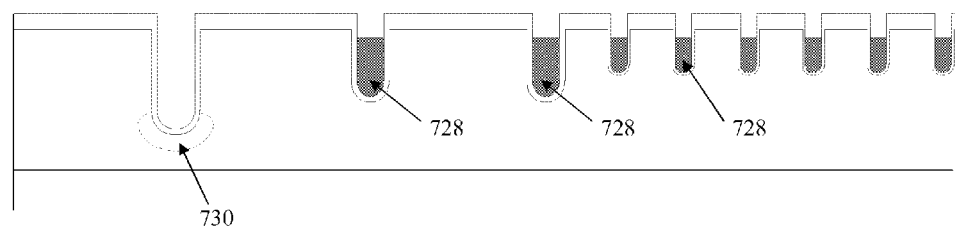
Figure 8L:
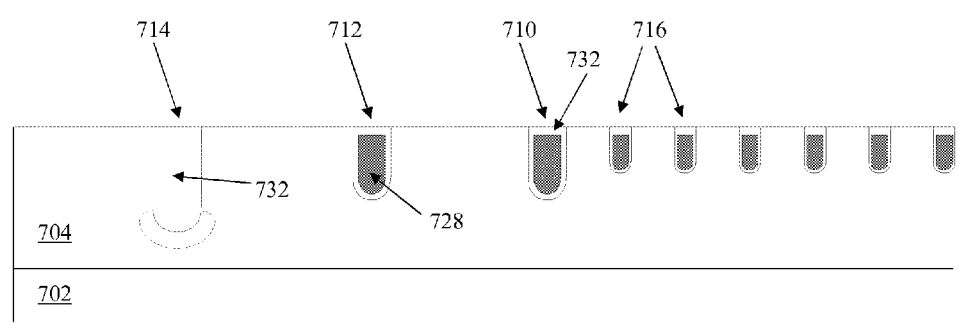
Figure 8M:
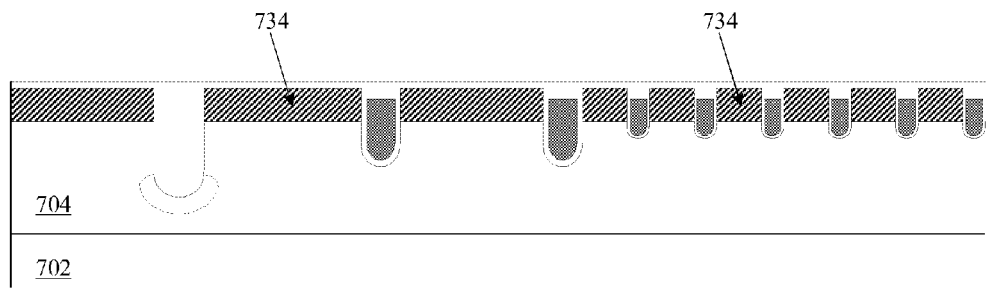
Figure 8N:
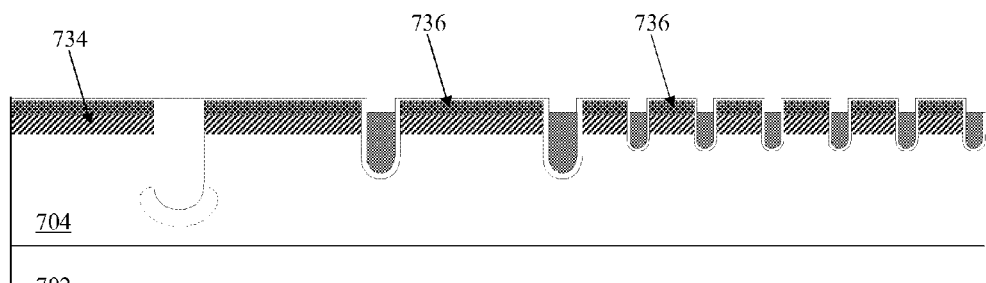
Figure 8O:
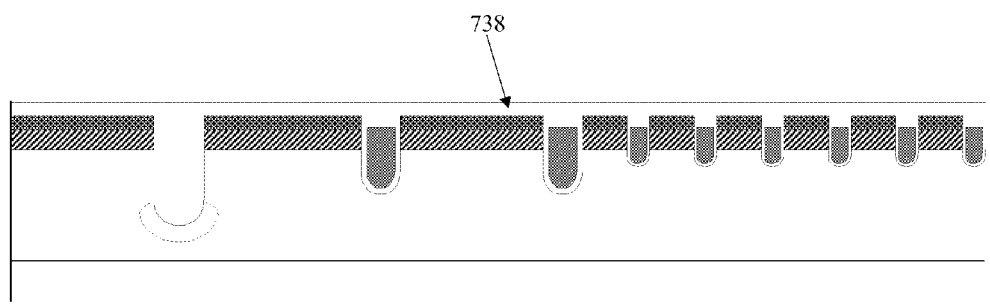
Figure 8P:
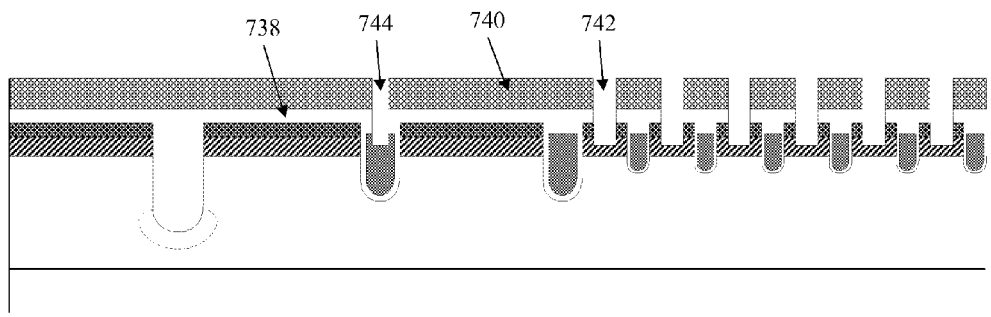
Figure 8Q:
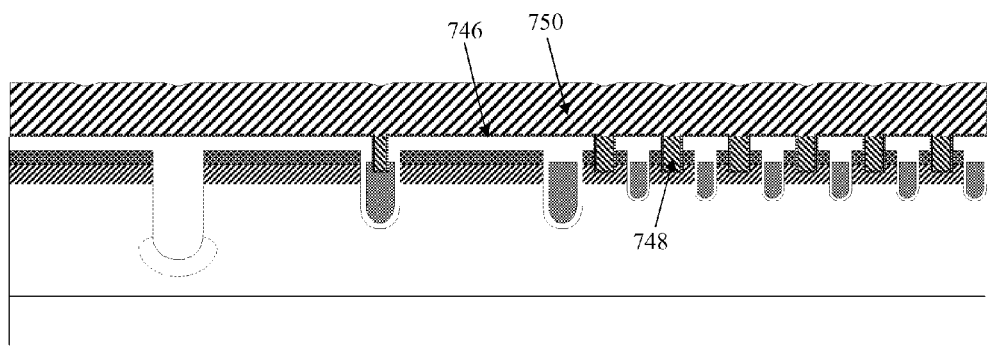
Figure 8R:
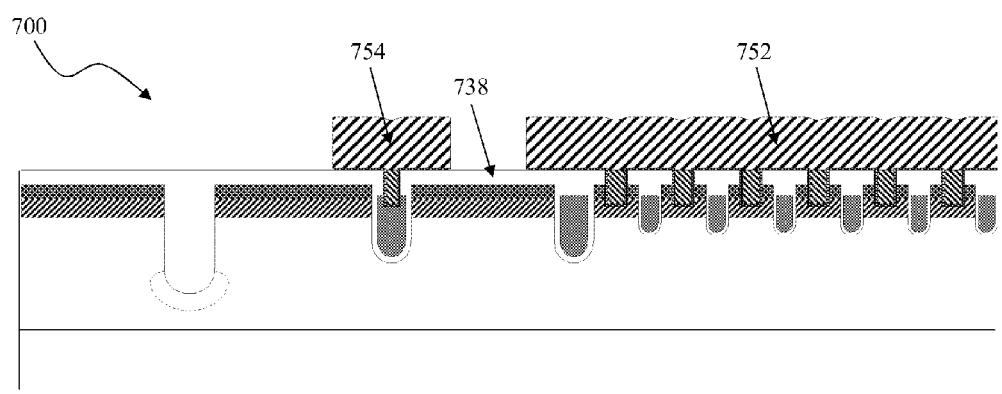

FIGS. 8A-8R outline a method of forming device 700 shown in FIGS. 7A-7B which only requires three masks. In FIG. 8A, a starting semiconductor substrate, e.g., having an n-epitaxial layer 704 over a bottom substrate 702 has an oxide layer 706 formed over it. In FIG. 8B, a trench mask 708 is applied as the first mask of the process, and trenches are etched into the epitaxial layer 704 through openings in the trench mask 708. The trenches include active trenches 716, gate runner trenches 710 which abut and surround the active trenches 716, gate runner trench 712, and termination trench 714. Gate runner trenches 710 and 712 are wider than active trenches 716, and termination trench 714 is wider than gate runner trenches 710,712. In FIG. 8C, the trench mask 708 is removed and a sacrificial oxide 718 is formed on the bottoms and sidewalls of trenches 710, 712, 714, 716. In FIG. 8D, a temporary polysilicon layer 720 is formed over the device. The polysilicon layer 720 has a thickness such that it completely fills narrower active trench 716 but only lines the sidewalls and bottom of wider trenches 710, 712, 714. An (isotropic) etch is performed which removes the polysilicon 720 from trenches 710, 712, 714, but leaves the polysilicon 720 in active trenches 716, as shown in FIG. 8E. In FIG. 8F, an oxide layer 722 is formed on the device. This thickens the oxide layer in trenches 710, 712, 714, and covers the polysilicon 720 in active trenches 716. The top oxide 722 is planarized, e.g. by CMP, to expose the top of polysilicon 720, but keeps the oxide 722 in trenches 710, 712, 714, as shown in FIG. 8G. In FIG. 8H, the temporary polysilicon 720 is removed. In FIG. 8I, the oxide in active trenches 716 is etched away, and an active gate oxide is formed. Optionally, a sacrificial oxide may be grown and removed before active gate oxide 726 is formed. Because the oxide in trenches 710, 712, 714 was thicker than the oxide in active trenches 716, it is not completely etched away during the oxide etch step, and at the end of the process, a thick gate oxide 724 is formed in trenches 710, 712, 714 which is thicker than the active gate oxide 726 in active trenches 716. In FIG. 8J, a polysilicon layer 728 is deposited on the device which fills trenches 710, 712, 716 but only lines the wide oxide termination trench 714. In FIG. 8K, the polysilicon material 728 is isotropically etched back so that it remains in trenches 710, 712, 716 but is removed from wide oxide termination trench 714. At this point a heavily doped (n+) channel stop region 730 may be formed at the bottom of wide oxide termination trench 714, e.g., by anisotropic implantation. The polysilicon layer 728 in trenches 710, 712, 716 blocks the implantation from the bottom of those trenches. An oxide 732 is deposited on the device to fill the rest of oxide termination trench 714 and cover the polysilicon layer 728. The oxide 732 is then planarized to the surface of epitaxial layer 704 as shown in FIG. 8L.

In FIG. 8M, a (p-type) body region 734 is formed throughout the entire die. In FIG. 8N, a (n-type) source region 736 is formed on the top of the body region 734. The body and source regions may be formed without a mask, as blanket implants. In FIG. 8O, a thick dielectric layer 738, may be formed over the device, e.g., by LTO and BPSG deposition and in FIG. 8P a contact mask 740 is applied. The contact mask 740 is only the second mask in this process. Active cell source/body contacts 742 are etched into the BPSG 738, source region 736 and body region 734. A (P+) body contact implant (not shown) may be performed into the exposed body regions 734. A gate contact 744 is also etched into the BPSG 738, and polysilicon in gate runner trench 712. In FIG. 8Q, the contact mask 740 is removed, and a conductive (e.g. tungsten) plug 748 is formed in the contacts 742, 744. A barrier metal 746 may first be formed before forming the tungsten plug 748. A metal layer 750 (e.g. aluminum) is formed over the device. In FIG. 8R, a metal mask (not shown) is applied to etch metal layer 750 into a source metal 752 and a gate metal 754, thus completing dual gate oxide MOSFET device 700 using only three masks. Though not shown, a drain metal may be formed on the back side of the device without using a mask.

While the above is a complete description of the preferred embodiment of the present invention, it is possible to use various alternatives, modifications and equivalents. For example a suitable alternative dielectric may be used in place of oxide. Also, in the descriptions above, examples of an n-channel device are typically used; however embodiments of the invention can also be applied to a p-channel device by reversing the conductivity types where applicable. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A semiconductor device comprising:
a plurality of gate electrodes over a gate insulator layer formed in active trenches located in an active region of a semiconductor substrate;
a first gate runner in a first gate runner trench formed in the semiconductor substrate and electrically connected to the gate electrodes, wherein the first gate runner abuts and surrounds the active region;
a second gate runner in a second gate runner trench connected to the first gate runner to make contact to a gate metal;
a dielectric filled trench formed in a region of the semiconductor substrate, wherein the dielectric filled trench surrounds the first and second gate runners and the active region, wherein the dielectric filled trench is filled only with dielectric material; and
a doped channel stop region under the dielectric filled trench, wherein the doped channel stop region is more heavily doped than the region of the semiconductor substrate in which the dielectric filled trench is formed.

2. The device of claim 1 wherein the semiconductor substrate includes a body layer in the active region and a termination region.

3. The device of claim 2 wherein the semiconductor substrate includes a source region.

4. The device of claim 3 wherein the source region is located only in the active region.

5. The device of claim 1 wherein the first gate runner includes a channel stop region formed under the first gate runner trench.

6. The device of claim 1 wherein the semiconductor device further comprises a semiconductor substrate having a bottom layer and a top layer, wherein the bottom layer is more heavily doped than the top layer and wherein the first gate runner trench is deep enough to reach the heavily doped bottom layer.

7. A method, comprising:
forming a plurality of gate electrodes over a gate insulator layer formed in active trenches located in an active region of a semiconductor substrate;
forming a first gate runner formed in the semiconductor substrate and electrically connected to the gate electrodes, wherein the first gate runner abuts and surrounds the active region;
forming a second gate runner connected to the first gate runner for making contact to a gate metal;
forming a dielectric filled trench in a region of the semiconductor substrate, wherein the dielectric filled trench surrounds the first and second gate runners and the active region, wherein the dielectric filled trench is filled only with dielectric material; and
forming a doped channel stop region under the dielectric filled trench, wherein the doped channel stop region is more heavily doped than the region of the semiconductor substrate in which the dielectric filled trench is formed.

8. The method of claim 7 wherein the semiconductor substrate includes a body layer in the active region and the termination region.

9. The method of claim 8 wherein the semiconductor substrate includes a source region.

10. The method of claim 9 wherein the source region is located only in the active region.

11. The method of claim 7 wherein the first gate runner includes a channel stop region formed under the trench.

12. The method of claim 7 wherein the semiconductor device further comprises a semiconductor substrate having a heavily doped bottom layer and a less heavily doped top layer, wherein the first gate runner trench is deep enough to reach the heavily doped bottom layer.

13. The method of claim 7, wherein forming the highly doped channel stop region under the dielectric filled trench includes implanting dopant ions into a region of the semiconductor substrate under the dielectric filled trench before the dielectric filled trench is completely filled with dielectric.

14. The method of claim 7, wherein forming the highly doped channel stop region under the dielectric filled trench includes implanting dopant ions into a region of the semiconductor substrate under the dielectric filled trench before the dielectric filled trench is completely filled with dielectric but while the active trenches and first and second gate runner trenches are filled with a material that blocks implantation of the dopant ions into regions of the semiconductor substrate under the active trenches and first and second gate runner trenches.

* * * * *